(12) United States Patent
Baeck et al.

(10) Patent No.: US 10,885,954 B2
(45) Date of Patent: Jan. 5, 2021

(54) MEMORY DEVICES COMPRISING A WRITE ASSIST CIRCUIT

(71) Applicant: Samsung Electronics Co., Ltd., Suwon-si (KR)

(72) Inventors: Sang-Yeop Baeck, Yongin-si (KR); Inhak Lee, Daegu (KR); SangShin Han, Suwon-si (KR); Tae-Hyung Kim, Yongin-si (KR); JaeSeung Choi, Hwaseong-si (KR); Sunghyun Park, Hwaseong-si (KR); Hyunsu Choi, Suwon-si (KR)

(73) Assignee: Samsung Electronics Co., Ltd.

(*) Notice: Subject to any disclaimer, the term of this patent is extended or adjusted under 35 U.S.C. 154(b) by 276 days.

(21) Appl. No.: 15/840,601

(22) Filed: Dec. 13, 2017

(65) Prior Publication Data

US 2018/0294018 A1 Oct. 11, 2018

(30) Foreign Application Priority Data

Apr. 11, 2017 (KR) .......................... 10-2017-0046849

(51) Int. Cl.

| | |
|---|---|
| *G11C 7/10* | (2006.01) |
| *G11C 11/419* | (2006.01) |
| *G11C 11/4096* | (2006.01) |
| *G11C 7/12* | (2006.01) |
| *G11C 5/14* | (2006.01) |
| *G11C 8/08* | (2006.01) |

(Continued)

(52) U.S. Cl.
CPC ............ *G11C 7/1096* (2013.01); *G11C 5/148* (2013.01); *G11C 7/1006* (2013.01); *G11C 7/12* (2013.01); *G11C 8/08* (2013.01); *G11C 8/16* (2013.01); *G11C 11/4096* (2013.01); *G11C 11/412* (2013.01); *G11C 11/419* (2013.01); *G11C 5/14* (2013.01)

(58) Field of Classification Search
CPC ..... G11C 7/1096; G11C 5/148; G11C 7/1006; G11C 7/12
USPC ..................................................... 365/189.16
See application file for complete search history.

(56) References Cited

U.S. PATENT DOCUMENTS

| | | | |
|---|---|---|---|
| 7,737,499 | B2 | 6/2010 | Kim |
| 7,898,875 | B2 | 3/2011 | Tao et al. |
| 8,730,712 | B2 | 5/2014 | Choi |

(Continued)

FOREIGN PATENT DOCUMENTS

KR 20110136642 12/2011

*Primary Examiner* — Anthan Tran
(74) *Attorney, Agent, or Firm* — Myers Bigel, P.A.

(57) ABSTRACT

A memory device includes a first write assist circuit providing a cell voltage or a write assist voltage to a first memory cell connected with a first bit line pair, a first write driver that provides write data to the first memory cell through the first bit line pair, a second write assist circuit that provides the cell voltage or the write assist voltage to a second memory cell connected with a second bit line pair, and a second write driver that provides write data to the second memory cell through the second bit line pair. One of the first and second write assist circuits provides the write assist voltage in response to a column selection signal for selecting one write driver, which provides write data, from among the first, and second write drivers, and the other thereof provides the cell voltage in response to the column selection signal.

18 Claims, 14 Drawing Sheets

(51) Int. Cl.
 *G11C 8/16* (2006.01)
 *G11C 11/412* (2006.01)

(56) References Cited

U.S. PATENT DOCUMENTS

| | | |
|---|---|---|
| 8,947,951 B2 | 2/2015 | Baeck et al. |
| 8,995,208 B2 | 3/2015 | Jung et al. |
| 9,153,304 B2 | 10/2015 | Kulkarni et al. |
| 9,224,453 B2 | 12/2015 | Jin et al. |
| 9,324,413 B2 | 4/2016 | Ko et al. |
| 9,496,028 B2 * | 11/2016 | Nii ........................ G11C 11/412 |
| 2009/0059706 A1 | 3/2009 | Wong |
| 2010/0002516 A1 | 1/2010 | Sim |
| 2013/0161713 A1 | 6/2013 | Yamazaki |
| 2014/0197469 A1 | 7/2014 | Lee |
| 2015/0279454 A1 * | 10/2015 | Sano .................... G11C 11/419 |
| | | 365/189.09 |
| 2016/0358644 A1 | 12/2016 | Hoist |
| 2017/0092371 A1 | 3/2017 | Harari |

\* cited by examiner

```
                                            VDDA
AS_en/
AS_s1  ------------------------  Voltage Level of Logic '1'

------ 0V
```

MEMORY DEVICES COMPRISING A WRITE ASSIST CIRCUIT

CROSS-REFERENCE TO RELATED APPLICATION

This U.S. non-provisional patent application claims priority under 35 U.S.C. § 119 to Korean Patent Application No. 10-2017-0046849 filed Apr. 11, 2017, in the Korean Intellectual Property Office, the entire contents of which are herein incorporated by reference.

BACKGROUND

Embodiments of the inventive concepts described herein relate to semiconductor memory devices, and more particularly, relate to memory devices including a write assist circuit.

In a memory device, such as, for example, a static random access memory (SRAM) device, memory cells may fail to secure a stable write operation due to a process variation occurring in a manufacturing process. For this reason, the SRAM device may use a write assist circuit that assists a write operation. During the write operation, the write assist circuit may temporarily adjust a voltage to be applied to a memory cell so as to be more advantageous to the write operation.

Only some of memory cells of the SRAM device may use a write assist operation. However, the write assist operation may be performed even in memory cells that do not perform the write operation. According to the above description, since the write assist operation may be performed on memory cells that do not need the write assist operation, power is unnecessarily consumed.

SUMMARY

Embodiments of the inventive concepts provide memory devices including a write assist circuit that operates in association with a selected column.

According to example embodiments of the inventive concepts, a memory device may include a first write assist circuit that provides a cell voltage or a write assist voltage to a first memory cell connected with a first bit line pair, a first write driver that provides write data to the first memory cell through the first bit line pair, a second write assist circuit that provides the cell voltage or the write assist voltage to a second memory cell connected with a second bit line pair, and a second write driver that provides write data to the second memory cell through the second bit line pair. One of the first write assist circuit and the second write assist circuit may provide the write assist voltage in response to a column selection signal for selecting one write driver, which provides write data, from among the first write driver and the second write driver, and the other of the first write assist circuit and the second write assist circuit may provide the cell voltage in response to the column selection signal.

According to example embodiments of the inventive concepts, a memory device may include a write driver, and a write assist circuit. The write assist circuit may include a first PMOS transistor connected between a cell voltage and an output node of the write assist circuit, a second PMOS transistor having a gate connected with a ground voltage and a first end connected with the output node, a first NMOS transistor connected with a second end of the second PMOS transistor and turned on or turned off according to a first signal from the write driver, and a second NMOS transistor connected in parallel with the first NMOS transistor and turned on or turned off according to a second signal provided from the write driver. The first and second PMOS transistors may be on a PMOS area of a substrate along a first direction perpendicular to a gate formation direction. The first and second NMOS transistors may be on an NMOS area of the substrate along the first direction. The second end of the second PMOS transistor may be connected with the first NMOS transistor through a contact area along the gate formation direction.

According to example embodiments of the inventive concepts, memory device may include a memory cell, a write assist circuit configured to deliver a cell voltage or an assist voltage to the memory cell, and a write driver connected to the memory cell by a bit line pair, the write driver configured to receive a column selection signal to select whether to provide write data to the memory cell and, responsive to the column selection signal, generate a assist selection signal to the write assist circuit. The assist voltage may be smaller than the cell voltage. If the memory cell is selected to receive write data by the column selection signal, the write assist circuit may be configured to deliver the assist voltage to the memory cell, and, if the memory cell is not selected to receive write data by the column selection signal, the write assist circuit may be configured to deliver the cell voltage to the memory cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Advantages and features of the inventive concepts and methods of achieving them will be made apparent with reference to the accompanying figures and the embodiments to be described below in detail. However, these inventive concepts should not be limited to the embodiments set forth herein and may be construed as various embodiments in different forms. Rather, these embodiments are provided so that disclosure of the inventive concepts is thorough and complete, and fully conveys the inventive concepts to those of ordinary skill in the art. The inventive concepts are defined by the appended claims.

The inventive concepts will be applied to volatile memory devices such as an SRAM, a dynamic random access memory (DRAM), a thyristor RAM (TRAM), a zero capacitor RAM (Z-RAM), and/or a twin transistor RAM (TTRAM) and/or nonvolatile memory devices such as a flash memory, a magnetoresistive RAM (MRAM), a spin transfer torque MRAM (STT-MRAM), a resistive RAM (RRAM), and/or a nanotube RRAM. However, embodiments of the inventive concepts are not limited thereto. Below, for convenience of description, the inventive concepts will be described by using the static random access memory device as an example.

Figure 1:
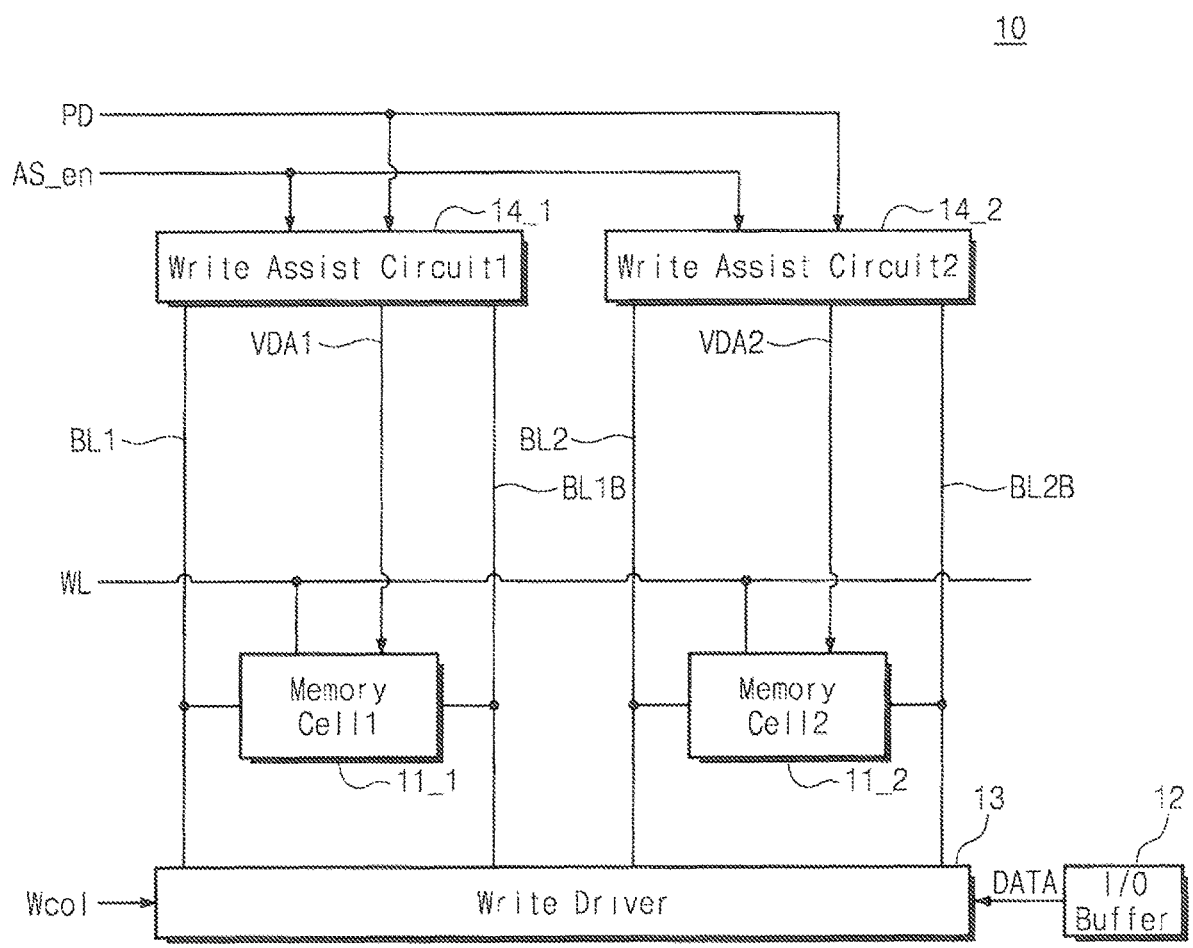
FIG. 1 is a block diagram illustrating an example configuration of a static random access memory device.

FIG. 1 is a block diagram illustrating an example configuration of a static random access memory device. Referring to FIG. 1, a static random access memory device 10 may include first and second memory cells 11_1 and 11_2, an input/output buffer 12, a write driver 13, and first and second write assist circuits 14_1 and 14_2.

The first memory cell 11_1 is connected between a first bit line BL1 and a first complementary bit line BL1B. The first memory cell 11_1 is connected to a word line WL. The second memory cell 11_2 is connected between a second bit line BL2 and a second complementary bit line BL2B. The second memory cell 11_2 is connected to the word line WL. Each of the first and second memory cells 11_1 and 11_2 may be a static random access memory cell. Herein, the first bit line BL1 and the first complementary bit line BL1B are referred to as a "first column" and/or "first bit line pair," and the second bit BL2 and the second complementary bit line BL2B are referred to as a "second column" and/or "second bit line pair."

The input/output buffer 12 provides data to the write driver 13. Although not illustrated in FIG. 1, the input/output buffer 12 may be provided with data from the outside (e.g., a host). For example, the input/output buffer 12 may be connected with one DQ pad (not illustrated). The write driver 13 is provided with data from the input/output buffer 12. The write driver 13 is also provided with a column selection signal Wcol. For example, the column selection signal Wcol may be provided from a column decoder (not illustrated). The write driver 13 provides data to a column selected according to the column selection signal Wcol. The write driver 13 may not provide data to a column that is not selected by the column selection signal Wcol.

For example, in the case where the first column is selected by the column selection signal Wcol, the write driver 13 provides data to the first bit line pair BL1 and BL1B. The write driver 13 provides a voltage to the first bit line BL1 that corresponds to the data provided to the write driver 13. The write driver 13 provides a voltage to the first complementary bit line BL1B that corresponds to the complement of the data provided to the write driver 13. If a word line driving voltage is applied to the word line WL, the provided data are written in the first memory cell 11_1.

The column selection signal Wcol may be distinguishable from a column address. The column address is an address for selecting one or more columns among a plurality of columns. The column selection signal Wcol is a signal for selecting one column from among the plurality of columns which is connected with one input/output buffer 12. In the example of FIG. 1, the column selection signal Wcol may be a 2-bit signal to select one of two columns.

This is only an example. For example, in the memory device 10, two or more columns may be connected with one input/output buffer 12. For example, the input/output buffer 12 may be connected with four columns. That is, one of four columns may be selected by the column selection line Wcol, and data may be provided to a bit line and a complementary bit line of the selected column. In this case, the column selection signal Wcol may be a 4-bit signal. Here, the write driver 13 provides data to a memory cell connected with a column, which is selected by the column selection signal Wcol, from among the four columns and does not provide data to memory cells connected with the remaining three columns.

The first write assist circuit 14_1 is connected with the first bit line pair BL1 and BL1B. The first write assist circuit 14_1 provides a first supply voltage VDA1 to the first memory cell 11_1 in response to a power-down signal PD and an enable signal AS_en. The first supply voltage VDA1 may be a cell voltage or a write assist voltage. In the case where the first write assist circuit 14_1 is deactivated, the first write assist circuit 14_1 provides the cell voltage to the first memory cell 11_1. The first write assist circuit 14_1 provides the write assist voltage to the first memory cell 11_1 while data are written in the first memory cell 11_1. For example, the write assist voltage may be lower than the cell voltage.

The power-down signal PD is a signal for deactivating the first and second write assist circuits 14_1 and 14_2 in a power-down mode in which the static random access memory device 10 does not operate dynamically. The enable signal AS_en is a signal for activating the first write assist circuit 14_1 and the second write assist circuit 14_2 during writing data in the first memory cell 11_1 or the second memory cell 11_2. For example, the power-down signal PD and the enable signal AS_en may be respectively provided from a controller (not illustrated) included in the static random access memory device 10.

The second write assist circuit 14_2 is connected with the second bit line pair BL2 and BL2B. The second write assist circuit 14_2 provides a second supply voltage VDA2 to the second memory cell 11_2 in response to the power-down signal PD and the enable signal AS_en. The second supply voltage VDA2 may be the cell voltage or the write assist voltage. In the case where the second write assist circuit 14_2 is deactivated, the second write assist circuit 14_2 provides the cell voltage to the second memory cell 11_2. The second write assist circuit 14_2 provides the write assist voltage to the second memory cell 11_2 while data are written in the second memory cell 11_2.

In order that data are written normally in a memory cell by the write driver 13, during writing data in the memory cell, drivability of the write driver 13 has to be higher than drivability of the memory cell. The reason is that, in the case where data stored in a memory cell are different from to-be-written data in a logical level, the write driver 13 inverts data stored in the memory cell. In some embodiments, drivability of a particular element may refer to the current sourcing ability of the element.

For this reason, during writing data in the first memory cell 11_1, the first write assist circuit 14_1 provides the first memory cell 11_1 with the write assist voltage lower than the cell voltage. Accordingly, the drivability of the first memory cell 11_1 may decrease. Also, during writing data in the second memory cell 11_2, the second write assist circuit 14_2 provides the second memory cell 11_2 with the write assist voltage lower than the cell voltage. Accordingly, the drivability of the second memory cell 11_2 may decrease. Through the above-described method, the first and second write assist circuits 14_1 and 14_2 assist write operations of the first and second memory cells 11_1 and 11_2 respectively.

Figure 2:
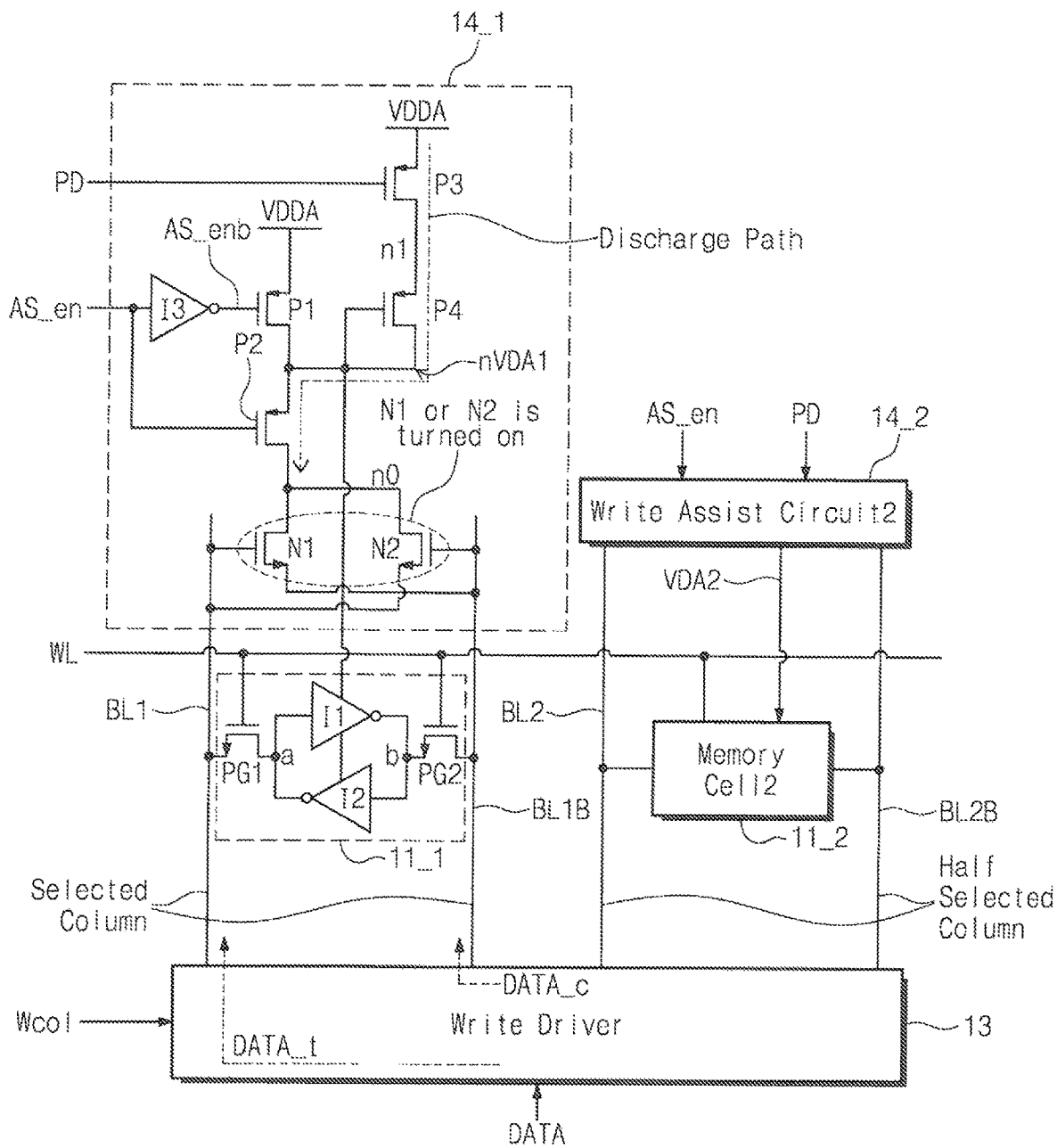
FIGS. 2 and 3 are views illustrating configurations and operations of first and second write assist circuits illustrated in FIG. 1.
Figure 3:
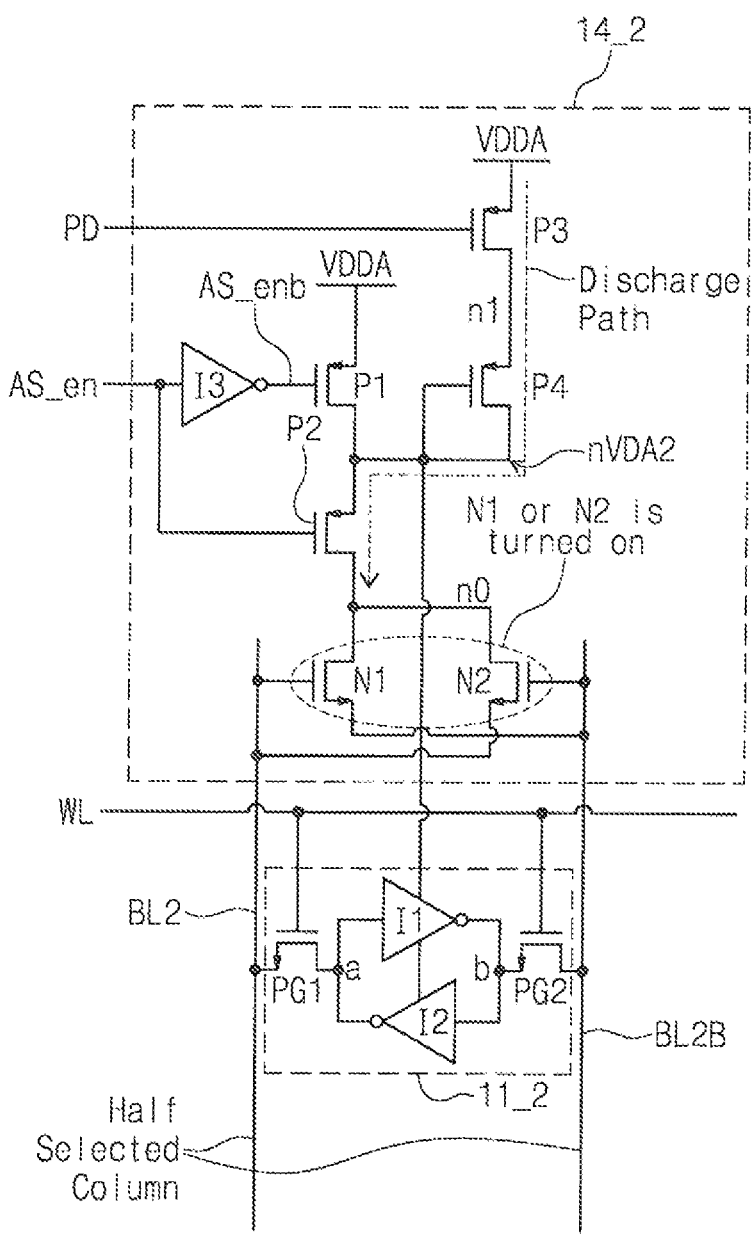

FIGS. 2 and 3 are views illustrating operations and configurations of first and second write assist circuits illustrated in FIG. 1. An example configuration of the first memory cell 11_1 will be described prior to describing the first and second write assist circuits 14_1 and 14_2.

The first memory cell 11_1 may include first and second inverters I1 and I2 and first and second pass gates PG1 and PG2. The first and second inverters I1 and I2 constitute a latch. Each of the first and second pass transistors PG1 and PG2 is turned on or off by a word line voltage of the word line WL. In a data write operation associated with the first memory cell 11_1, a voltage of the first bit line BL1 is provided to a node a when the first and second pass gates PG1 and PG2 are respectively turned on. Also, a voltage of the first complementary bit line BL1B is provided to a node b. The first and second inverters I1 and I2 maintain the voltages of the nodes a and b. Accordingly, the voltages of the nodes a and b may not be inverted. A configuration and an operation of the second memory cell 11_2 are substantially the same as the configuration and the operation of the first memory cell 11_1.

The first write assist circuit 14_1 may include first to fourth PMOS transistors P1 to P4, first and second NMOS transistors N1 and N2, and a third inverter I3. The first PMOS transistor P1 is connected between a cell voltage VDDA and a node nVDA1. The first PMOS transistor P1 is turned on or off by an enable bar signal AS_enb that is an output of the third inverter I3. The second PMOS transistor P2 is connected between the node nVDA1 and a node n0. The second PMOS transistor P2 is turned on or off according to the enable signal AS_en.

The third PMOS transistor P3 is connected between the cell voltage VDDA and a node n1. The third PMOS transistor P3 is turned on or off according to the prover-down signal PD. For example, in the case where the static random access memory device 10 performs an operation such as a write operation or a read operation, the power-down signal PD of logic "0" is provided. In the following embodiment, it is assumed that the power-down signal PD of logic "0" is provided. The fourth PMOS transistor P4 is connected between the node n1 and the node nVDA1. One end of the fourth PMOS transistor P4 is connected with a gate thereof and the node nVDA1.

The first NMOS transistor N1 is connected between the node n0 and the first complementary bit line BL1B. The first NMOS transistor N1 is turned on or off according to a voltage of the first bit line BL1. The second NMOS transistor N2 is connected between the node n0 and the first bit line BL1. The second NMOS transistor N2 is turned on or off according to a voltage of the first complementary bit line BL1B.

Unlike an exemplification of FIG. 2, the first and second columns may not be selected by the column selection signal Wcol. In this case, the first write assist circuit 14_1 is provided with the enable signal AS_en of logic "1." The first PMOS transistor P1 is turned on by the enable bar signal AS_enb of logic "0." The second PMOS transistor P2 is turned off by the enable signal AS_en of logic "1." The cell voltage VDDA is applied to the node nVDA1 by the turned-on first PMOS transistor P1. The fourth PMOS transistor P4 is turned off by the cell voltage VDDA applied to the gate thereof. As a result, the first write assist circuit 14_1 provides the cell voltage VDDA to the first memory cell 11_1 through the node nVDA1. Likewise, the second write assist circuit 14_2 provides the cell voltage VDDA to the second memory cell 11_2 through a node nVDA2 (FIG. 3). Since the cell voltage VDDA that is higher than the write assist voltage is supplied to the first and second memory cells 11_1 and 11_2, the first and second memory cells 11_1 and 11_2 normally maintain data stored therein.

FIG. 2 shows an operation of the first write assist circuit 14_1 when the first column is selected by the column selection signal Wcol. Here, data DATA illustrated FIG. 1 may include true data DATA_t and complementary data DATA_c. During a data write operation, the true data DATA_t may be a signal corresponding to the data DATA buffered by the write driver 13, and the complementary data DATA_c may be data complementary to the true data DATA_t. However, in an operation(s) except for the data write operation, the true data DATA_t may be provided by using a signal having the same logical level as the complementary data DATA_c. For example, the write driver 13 may be provided with both the complementary data DATA_c and the true, data DATA_t from the input/output buffer 12. Also, the write driver 13 may be provided with the data DATA from the input/output buffer 12 and may generate the true data DATA_t and the complementary data DATA_c from the data DATA. To this end, although not illustrated, the write driver 13 may further include logic and/or circuitry for generating the true data DATA_t and the complementary data DATA_c.

In the case where the first column is selected, the write driver 13 provides the first bit line pair BL1 and BL1B with the data DATA provided from the input/output buffer 12 of FIG. 1. In detail, the write driver 13 provides the true data DATA_t to the first bit line BL1 and provides the complementary data DATA_c to the first complementary bit line BL1B. If a word line voltage is provided to the word line WL, the first memory cell 11_1 stores the true data DATA_t and the complementary data DATA_c. For example, it is assumed that the true data DATA_t is logic "1" and the complementary data DATA_c is logic "0."

In a partial period of a data write process, the first write assist circuit 14_1 provides the write assist voltage to the first memory cell 11_1. For example, the partial period may include a period in which the enable signal AS_en is activated to logic "0." A process in which the write assist voltage is generated by the first write assist circuit 14_1 is as follows.

Figure 5:
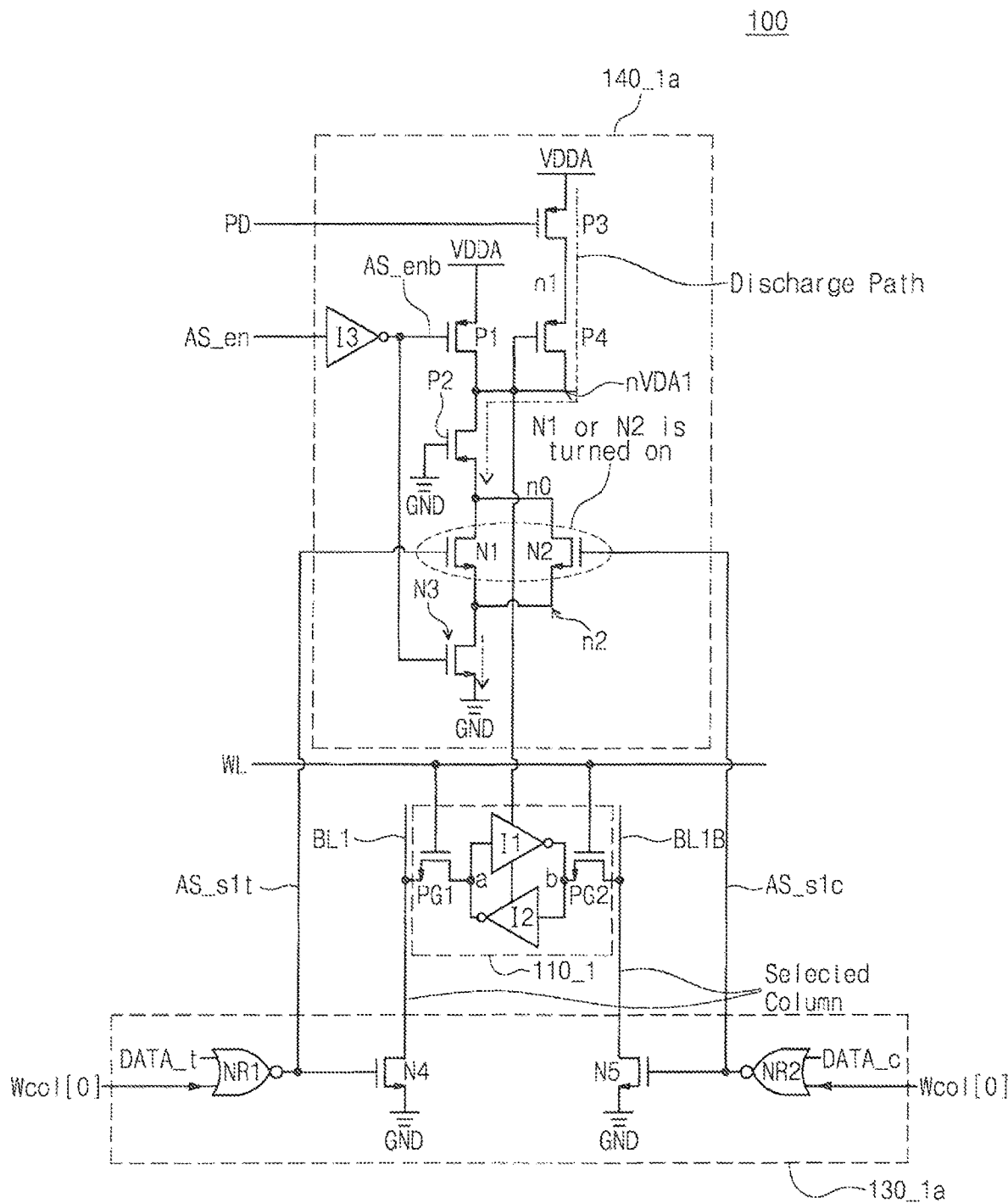
FIGS. 5 and 6 are views illustrating a configuration and an operation of the first write assist circuit illustrated in FIG. 4, according to an embodiment of the inventive concepts.

The first PMOS transistor P1 is turned off by the enable bar signal AS_enb of logic "1." The second PMOS transistor P2 is turned on by the enable signal AS_en of logic "0." The first NMOS transistor N1 is turned on by a voltage of the first bit line BL1 developed to a voltage of logic "1." The second NMOS transistor N2 is turned off by a voltage of the first complementary bit line BL1B developed to a voltage of logic "0" or a ground voltage. A discharge path is formed from a node having the cell voltage VDDA to the first complementary bit line BL1B having the ground voltage through the third, fourth, and second PMOS transistors P3, P4, and P2 and the first NMOS transistor N1. For example, in the case where the true data DATA_t is logic "0" and the complementary data DATA_c is logic "1," through a process that is substantially the same as described above, a discharge path is formed through the third, fourth, and second PMOS transistors P3, P4, and P2 and the second NMOS transistor N2. In FIG. 5, the same description is omitted.

Through the formed discharge path, a voltage of the node nVDA1 decreases to a voltage that is lower than the cell voltage VDDA by a source-drain voltage of the third PMOS transistor P3 and a turn-on voltage of the fourth PMOS transistor P4. Hereinafter, a sum of the source-drain voltage and the turn-on voltage may be referred to as a "delta voltage." In FIG. 2, the turn-on voltage is a source-drain voltage or a gate-source voltage of the fourth PMOS transistor P4. For example, in the case where a drain of the fourth PMOS transistor P4 is connected with the third PMOS transistor P3 and a source of the fourth PMOS transistor P4 is connected with a gate thereof, the turn-on voltage is a gate-drain voltage of the fourth PMOS transistor P4. The decreased voltage is provided to the first memory cell 11_1 through the node nVDA1 as the write assist voltage. A configuration and an operation of the second write assist circuit 14_2 are substantially the same as the configuration and the operation of the first write assist circuit 14_1.

The first write assist circuit 14_1 illustrated in FIGS. 1 and 2 starts to generate the write assist voltage after the first bit line BL1 or the first complementary bit line BL1B is sufficiently developed to the ground voltage. For example, in the case where a start time point of the developing process is delayed, the first write assist circuit 14_1 may fail to supply the write assist voltage to the first memory cell 11_1 for sufficient time.

FIG. 3 shows an operation of the second write assist circuit 14_2 when the second column is not selected by the column selection signal Wcol. The power-down signal PD and the enable signal AS_en are input to be the same as described with reference to FIG. 2. FIG. 3 uses similar reference designators as FIG. 2 to indicate similar elements within the second write assist circuit 14_2.

Since the second column is not selected, voltages of the second bit line BL2 and the second complementary bit line BL2B are not developed by the true data DATA_t and the complementary data DATA_c respectively. Since the second memory cell 11_2 is connected with the same word line WL as the first memory cell 11_1, the first and second pass gates PG1 and PG2 of the second memory cell 11_2 are turned on by the word line voltage. Below, a column corresponding to the case in which the word line voltage is active but the column is not selected is referred to as a "half selected column".

The second bit line pair BL2 and BL2B that is not selected by the column selection signal Wcol is floated. Accordingly, the second bit line BL2 and the second complementary bit line BL2B are respectively developed to voltages of the nodes a and b by the first and second inverters I1 and I2. For example, it is assumed that logic "1" is stored at the node a, and logic "0" is stored at the node b. According to the assumption, the second bit line BL2 is developed to a voltage of logic "1," and the second complementary bit line BL2B is developed to a voltage of logic "0." Accordingly, the first NMOS transistor N1 is turned on by a voltage of the second bit line BL2. A discharge path is formed from a node having the cell voltage VDDA to the second complementary bit line BL2B having the ground voltage through the third, fourth, and second PMOS transistors P3, P4, and P2 and the first NMOS transistor N1.

For example, in the case where logic "0" is stored at the node a and logic "1" is stored at the node b, through a process that is substantially the same as described herein with respect to FIG. 2, a discharge path is formed through the third, fourth, and second PMOS transistors P3, P4, and P2 and the second NMOS transistor N2. A voltage of the node nVDA2 decreases to the write assist voltage by the discharge path. The decreased voltage is provided to the second memory cell 11_2 through the node nVDA2 as the write assist voltage.

In an example of FIG. 3, the second write assist circuit 14_2 that is connected with the half selected column where a write operation is not performed operates to generate the write assist voltage. Accordingly, the static random access memory device 10 consumes power unnecessarily. Also, the second memory cell 11_2 does not perform a data write operation. However, since the write assist voltage lower than the cell voltage VDDA is applied to the second memory cell 11_2, data stored in the second memory cell 11_2 may be unstable.

Figure 4:
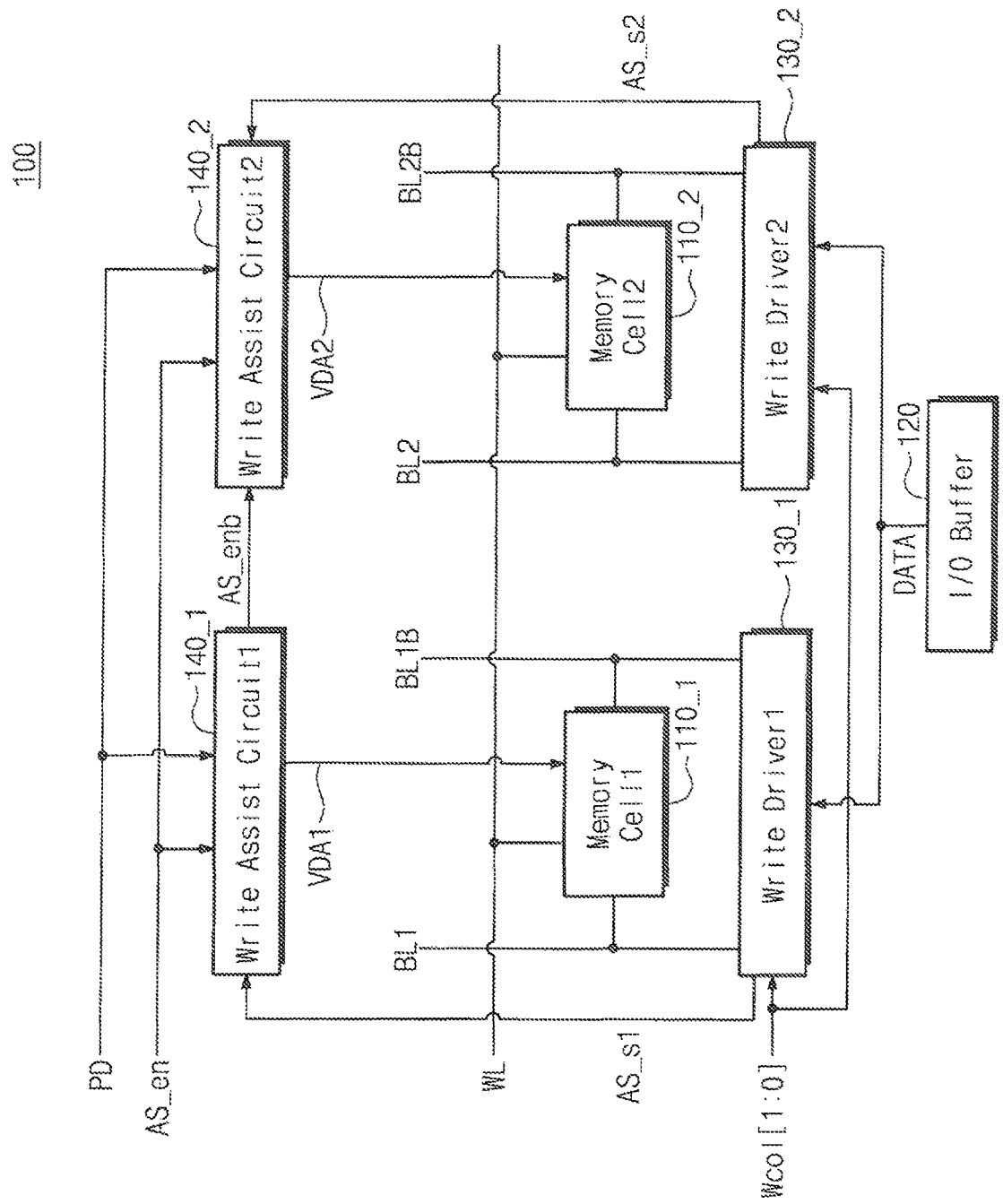
FIG. 4 is a block diagram illustrating a configuration of the static random access memory device according to an embodiment of the inventive concepts.

FIG. 4 is a block diagram illustrating a configuration of a static random access memory device according to an embodiment of the inventive concepts. Referring to FIG. 4, a static random access memory device 100 may include first and second memory cells 110_1 and 110_2, an input/output buffer 120, first and second write drivers 130_1 and 130_2, and first and second write assist circuits 140_1 and 140_2. Configurations and operations of the first and second memory cells 110_1 and 110_2 and the input/output buffer 120 are substantially the same as those described with reference to FIGS. 1 to 3. In FIG. 4, a column selection signal Wcol[1:0] includes a 2-bit signal, though the inventive concepts are not limited thereto. In the embodiment of FIG. 4, the second write assist circuit 140_2 is provided with the enable signal AS_en and the enable bar signal AS_enb. However, according to the embodiments of the inventive concepts, the second write assist circuit 140_2 may be provided with at least one of the enable signal AS_en and the enable bar signal AS_enb.

Unlike the write driver 13 of FIG. 1, the first and second write drivers 130_1 and 130_2 may provide first and second assist selection signals AS_s1 and AS_s2 to the first and second write assist circuits 140_1 and 140_2, respectively. The first and second assist selection signals AS_s1 and AS_s2 may be generated by the first and second write drivers 130_1 and 130_2 based on the column selection signal Wcol[1:0].

Unlike the first and second write assist circuits 14_1 and 14_2 of FIG. 1, the first write assist circuit 140_1 of FIG. 4 may not be connected with the first bit line pair BL1 and BL1B, and the second write assist circuit 140_2 of FIG. 4 may not be connected with the second bit line pair BL2 and BL2B. One write driver, which is selected according to the column selection signal Wcol[1:0], from among the first and second write drivers 130_1 and 130_2 may provide data to a column connected with the selected write driver. An unselected write driver may not provide data to a column connected with the unselected write driver. One write assist circuit, which is selected according to the first and second assist selection signals AS_s1 and AS_s2, from among the first and second write assist circuits 140_1 and 140_2 may provide the write assist voltage to a memory cell connected with the selected write assist circuit. An unselected write assist circuit may provide the cell voltage VDDA to a memory cell connected with the unselected write assist circuit.

Through the above-described configuration, each of the first and second write assist circuits 140_1 and 140_2 may generate the write assist voltage regardless of voltages of bit lines. Accordingly, a time needed to generate and supply the write assist voltage may decrease. Also, through the first and second assist selection signals AS_s1 and AS_s2, a write assist circuit, which corresponds to the half selected column, from among the fast and second write assist circuits 140_1 and 140_2 may not operate to generate the write assist voltage. Accordingly, a memory cell of the half selected column may store data more stably. Also, power consumption may be reduced.

Figure 6:
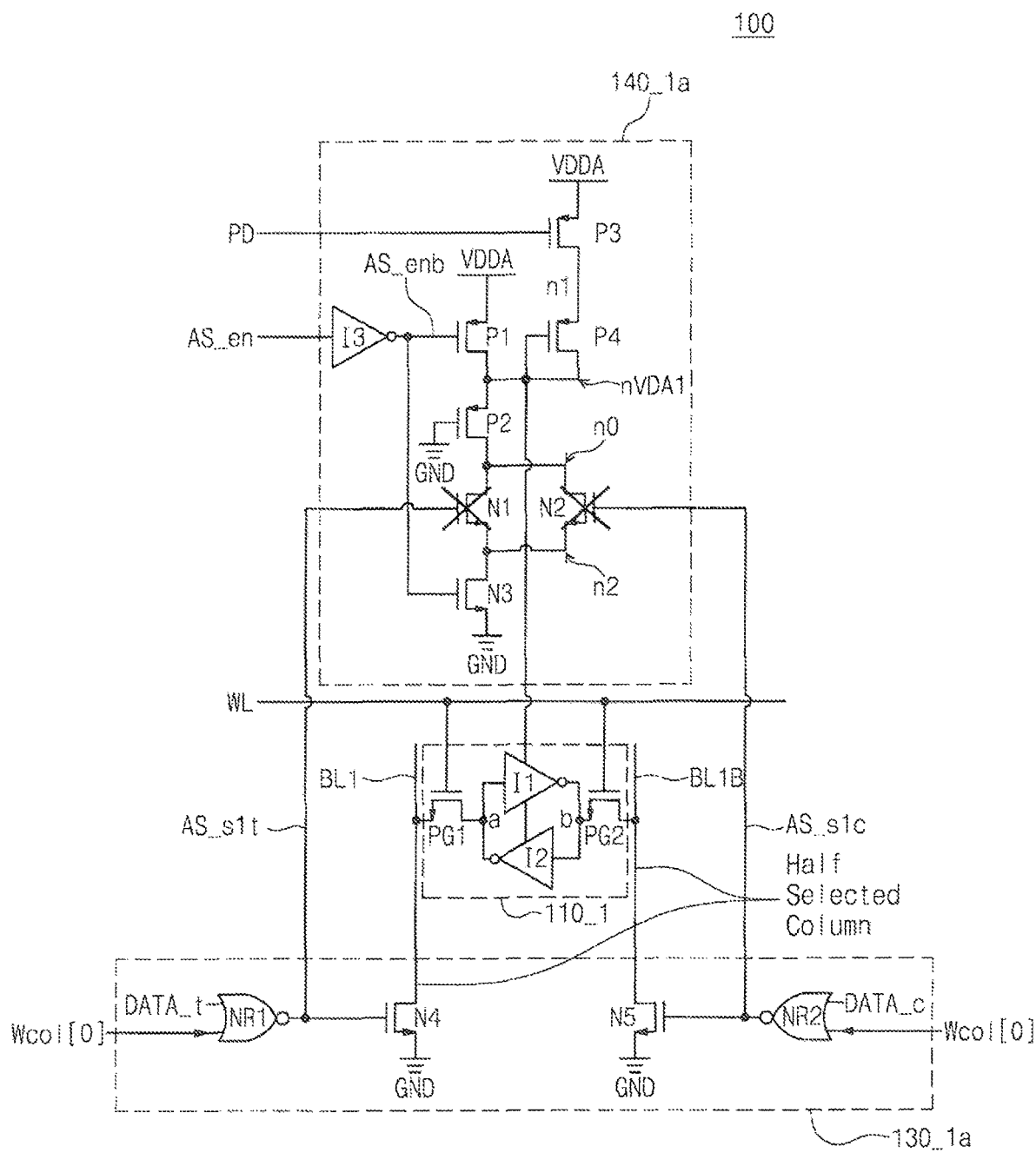

FIGS. 5 and 6 are views illustrating a configuration and an operation of a first write assist circuit illustrated in FIG. 4, according to an embodiment of the inventive concepts. An example configuration of a first write driver 130_1*a* wild be described prior to describing a first write assist circuit 140_1*a*. A configuration and an operation of the second write driver 130_2*a* are substantially the same as a configuration and an operation of the first write driver 130_1*a*.

The first write driver 130_1*a* may include first, and second NOR logics NR1 and NR2 and fourth and fifth NMOS transistors N4 and N5. The first NOR logic NR1 may perform a NOR operation on the column selection signal Wcol[0] and the true data DATA_t to output a first true assist selection signal AS_s1*t*. The fourth NMOS transistor N4 may be connected between the first bit line BL1 and a ground voltage GND. The fourth NMOS transistor N4 may be turned on or off according to the first true assist selection signal AS_s1*t* such that the ground voltage GND is selectively supplied to the first bit line BL1.

In the case where the first column is not selected, the column selection signal Wcol[0] of logic "1" may be provided. The first NOR logic NR1 may output the first true assist selection signal AS_s1*t* of logic "0" regardless of the true data DATA_t. In this case, the fourth NMOS transistor N4 may be turned off, and thus, the first bit line BL1 is floated. Accordingly, the true data DATA_t may not be provided to the first bit line BL1. In the case where the first column is selected, the column selection signal Wcol[0] of logic "0" may be provided. The first NOR logic NR1 may invert true data DATA_t and may output the inverted result as the first true assist selection signal AS_s1*t*. The fourth NMOS transistor N4 may be turned on or off according to the first true assist selection signal AS_s1*t*. A signal corresponding to the true data DATA_t may be transferred to the first bit line BL1 by operation of the fourth NMOS transistor N4.

The second NOR logic NR2 may perform a NOR operation on the column selection signal Wcol[0] and the complementary data DATA_c to output a first complementary assist selection signal AS_s1*c*. The fifth NMOS transistor N5 may be connected between the first complementary bit line BL1B and the ground voltage GND. The fifth NMOS transistor N5 may be turned on or off according to the first complementary assist selection signal AS_s1*c* such that the ground voltage GND may be selectively supplied to the first complementary bit line BL1B. A process in which a signal corresponding to the complementary data DATA_c is transferred to the first complementary bit line BL1B by the second. NOR logic NR2 and the fifth NMOS transistor N5 is substantially the same as the process performed through the first NOR logic NR1 and the fourth NMOS transistor N4.

In the embodiment of FIGS. 5 and 6, the first assist selection signal AS_s1 illustrated in FIG. 4 may include the first true assist selection signal AS_s1*t* and the first complementary assist selection signal AS_s1*c*. Hereinafter, a configuration and an operation of the first write assist circuit 140_1*a* will be described.

The first write assist circuit 140_1*a* may include the first to fourth PMOS transistors P1 to P4, first to third NMOS transistors N1 to N3, and the third inverter I3. The first PMOS transistor P1 may be connected between the cell voltage VDDA and the node nVDA1. The first PMOS transistor P1 may be turned on or off by the enable bar signal AS_enb that is an output of the third inverter I3. The second PMOS transistor P2 may be connected between the node nVDA1 and the node n0. A gate of the second PMOS transistor P2 may be connected with the ground voltage GND so as to be turned on always. The third PMOS transistor P3 may be connected between the cell voltage VDDA and the node n1. The third PMOS transistor P3 may be turned on or off according to the power-down signal PD. The fourth PMOS transistor P4 may be connected between the node n1 and the node nVDA1. One end of the fourth PMOS transistor P4 may be connected with a gate thereof and the node nVDA1.

The first NMOS transistor N1 may be connected between the node n0 and the node n2. The first NMOS transistor N1 may be turned on or off according to a voltage of the first true assist selection signal AS_s1*t*. The second NMOS transistor N2 may be connected between the node n0 and the node n2. The second NMOS transistor N2 may be turned on or off according to a voltage of the first complementary assist selection signal AS_s1*c*. The third NMOS transistor N3 may be connected between the node n2 and the ground voltage GND. The third NMOS transistor N3 may be turned on or off according to the enable bar signal AS_enb.

The second write assist circuit 140_2*a* may not include the third inverter I3. A configuration of the second write assist circuit 140_2*a* may be substantially the same as that of the first write assist circuit 140_1*a* except for the third inverter I3. That is, the second write assist circuit 140_2*a* may be provided with the enable bar signal AS_enb from the first write assist circuit 140_1*a*.

FIG. 5 shows an operation of the first write assist circuit 140_1*a* when the first column is selected by the column selection signal Wcol[0]. In FIGS. 5 and 6, the power-down signal PD and the enable signal AS_en are input to be the same as described with reference to FIG. 2. For example, it is assumed that the true data DATA_t is logic "0" and the complementary data DATA_c is logic "1." In the case were the first column is selected, the column selection signal Wcol[0] logic "0" may be provided. The first NOR logic NR1 may perform a NOR operation on the input signals Wcol[0] and DATA_t to output the first true assist selection signal AS_s1*t* of logic "1." The second NOR logic NR2 may perform a NOR operation on the input signals Wcol[0] and DATA_c to output the first complementary assist selection signal AS_s1*c* of logic "0."

Before data are written, the first bit line BL1 and the first complementary bit line BL1B may be precharged with a voltage of logic "1." The fourth NMOS transistor N4 may be turned on according to the first true assist selection signal AS_s1*t* of logic "1," and thus, the first bit line BL1 is discharged to the ground voltage GND. The fifth NMOS transistor N5 may be turned off according to the first complementary assist selection signal AS_s1*c* of logic "0," and thus, a voltage of the first complementary bit line BL1B corresponding to logic "1" is maintained. As a word line voltage is applied to the word line WL, the first and second inverters I1 and I2 store data defined by voltages of the first bit line BL1 and the first complementary bit line BL1B.

In a partial period of a data write process, the first write assist circuit 140_1*a* may provide the write assist voltage to the first memory cell 110_1. A process in which the write assist voltage is generated by the first write assist circuit 140_1*a* is as follows.

The first PMOS transistor P1 may be turned off by the enable bar signal AS_enb of logic "1." The third NMOS transistor N3 may be turned on by the enable bar signal AS_enb of logic "1." The first NMOS transistor N1 may be turned on by the first true assist selection signal AS_s1t of logic "1." The second NMOS transistor N2 may be turned off by the first complementary assist selection signal AS_s1c of logic "0." As a result, a discharge path may be formed from the cell voltage VDDA to the ground voltage GND through the third, fourth, and second PMOS transistors P3, P4, and P2 and the first and third NMOS transistors N1 and N3.

A voltage of the node nVDA1 may decrease to a voltage lower than the cell voltage VDDA by the delta voltage through the formed discharge path. The decreased voltage may be provided to the first memory cell 110_1 through the node nVDA1 as the write assist voltage. As described with reference to FIG. 2, the delta voltage corresponds to a sum of the source-drain voltage of the third PMOS transistor P3 and the turn-on voltage of the fourth PMOS transistor P4. An operation of the second write assist circuit 140_2a is substantially the same as the operation of the first write assist circuit 140_1a.

The first write assist circuit 140_1a illustrated in FIGS. 4 and 5 may generate the write assist voltage in response to the first true assist selection signal AS_s1t and the first complementary assist selection signal AS_s1c, regardless of voltages of the first bit line BL1 and the first complementary bit line BL1B. Accordingly, compared with the first write assist circuit 14_1 of FIG. 1, the first write assist circuit 140_1a may provide the write assist voltage to the first memory cell 110_1 within a relatively short time.

FIG. 6 shows an operation of the first write assist circuit 140_1a when the first column corresponds to the half selected column. Since the first column is not selected, the column selection signal Wcol[0] of logic "1" may be provided. The first NOR logic NR1 may output the first true assist selection signal AS_s1t of logic "0." The first NMOS transistor N1 may be turned off according to the first true assist selection signal AS_s1t of logic "0." The second NOR logic NR2 may output the first complementary assist selection signal AS_s1c of logic "0." The second NMOS transistor N2 may be turned off according to the first complementary assist selection signal AS_s1c of logic "0."

Since the first and second NMOS transistors N1 and N2 are all turned off, a discharge path from the cell voltage VDDA to the ground voltage GND may not be formed. As a result, the node nVDA1 is maintained with the cell voltage VDDA, which is set before the first column is half-selected, without voltage drop.

Compared with the first write assist circuit 14_1 of FIG. 1, the first write assist circuit 140_1a that is connected with the half selected column provides the first memory cell 110_1 with the cell voltage VDDA, not the write assist voltage. Since an unnecessary operation of generating the write assist voltage is not performed, power consumption of the static random access memory device 100 may be reduced. Also, the first write assist circuit 140_1a may provide the cell voltage VDDA to the first memory cell 110_1 while data are stored in the first memory cell 110_1. Accordingly, even in the case where the first column corresponds to the half selected column, the first memory cell 110_1 may stably maintain data stored therein.

In addition, how the first write driver 130_1a and the first write assist circuit 140_1a operate when a write mask operation is performed will be described. Even though the write mask operation is a data write operation, a write operation is not performed on a column connected with a specific DQ during the write mask operation. For example, in the case where the static random access memory device 100 includes eight DQ pads, the static random access memory device 100 may receive eight data bits through the eight DQ pads every clock edge. However, the static random access memory device 100 may not write data provided through DQ pads, the number of which is requested by a host (not illustrated), from among the eight DQ pads. That is, the static random access memory device 100 may perform the write mask operation on a column (e.g., the first column) connected with the requested DQ pads.

In the case where the first write driver 130_1a performs the write mask operation, the column selection signal Wcol [0] of logic "0" may be provided because the first column is selected. However, the true data DATA_t of logic "1" and the complementary data DATA_c of logic "1" may be provided. Accordingly, the first NOR logic NR1 may output the first true assist selection signal AS_s1t of logic "0," and the second NOR logic NR2 may output the first complementary assist selection signal AS_s1c of logic "0." The fourth and fifth NMOS transistors N4 and N5 may be respectively turned off by the first true and complementary assist selection signals AS_s1t and AS_s1c of logic "0." Accordingly, each of the first bit line BL1 and the first complementary bit line BL1B may maintain a precharged voltage of logic "1."

Also, the first NMOS transistor N1 may be turned off by the first true assist selection signal AS_s1t of logic "0." The second NMOS transistor N2 may be turned off by the first complementary assist selection signal AS_s1c of logic "0." Accordingly, a discharge path from the cell voltage VDDA to the ground voltage GND may not be formed. As a result, the node nVDA1 may be maintained with the cell voltage VDDA, which is set before the first column is half-selected, without voltage drop. That is, in the write mask operation, the first write assist circuit 140_1a may provide the first memory cell 110_1 with the cell voltage VDDA, not the write assist voltage. Accordingly, the first memory cell 110_1 may stably maintain data stored therein.

Figure 7:
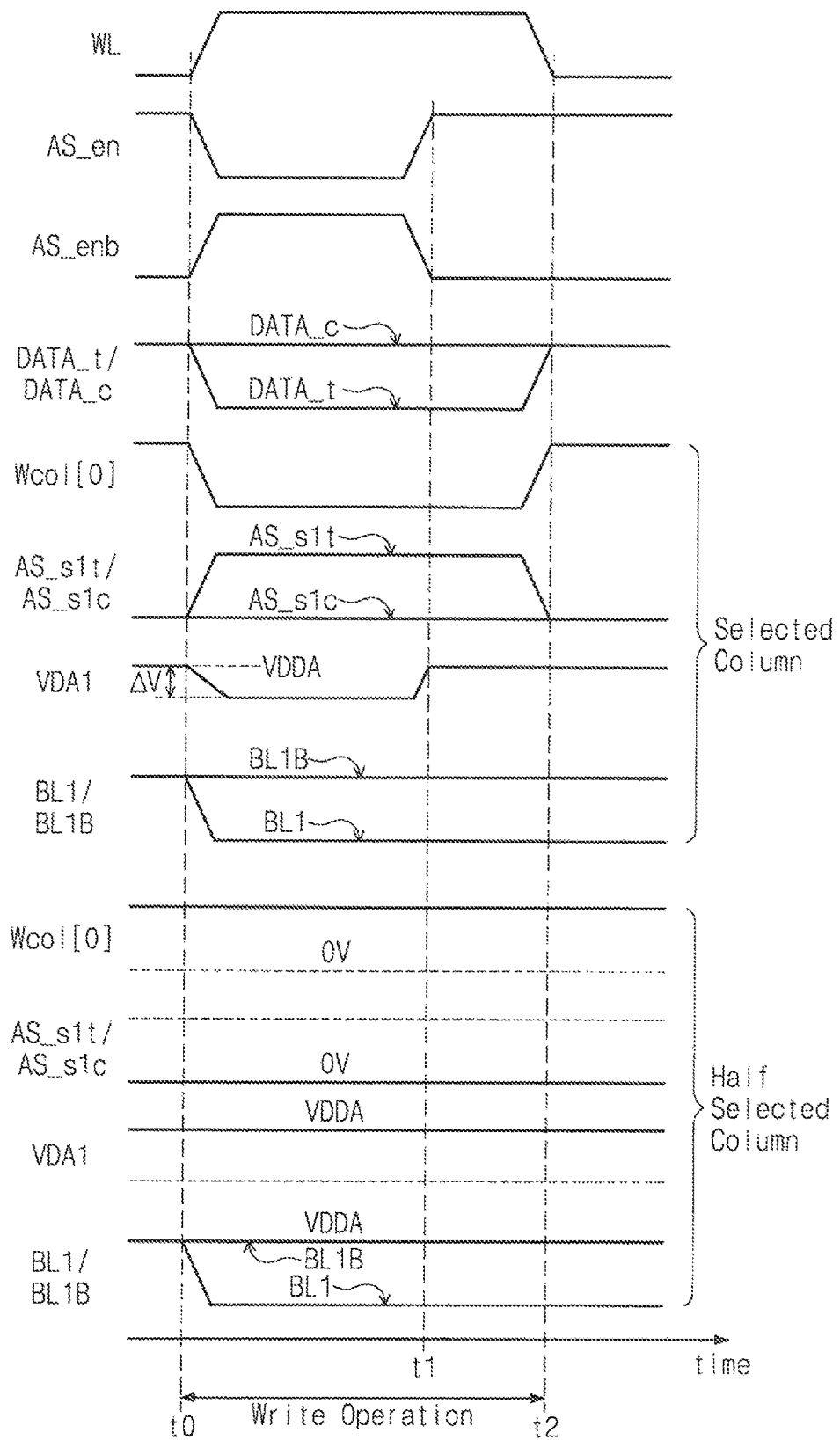
FIG. 7 is a timing diagram for describing an operation of the first write assist circuit illustrated in FIGS. 5 and 6.

FIG. 7 is a timing diagram for describing an operation of a first write assist circuit illustrated in FIGS. 5 and 6. FIG. 7 will be described with reference to FIGS. 5 and 6. Referring to FIG. 7, the first write driver 130_1a and the first write assist circuit 140_1a may perform a write operation in a period from t0 to t2. For convenience of description, a delay time of a signal due to logic circuits is not illustrated in FIGS. 7 and 15. Also, a margin of each signal may increase or decrease according to a design environment. In addition, in each signal, a high level may be any voltage level without being limited to the cell voltage VDDA, and a low level may be any voltage level without being thrilled to the ground voltage GND.

In a period from t0 to t1, a word line voltage of logic "1" may be provided to the word line WL. The enable signal AS_en of logic "0" may be provided. The enable bar signal AS _enb of logic "1" may be provided. Also, the true data DATA_t of logic "0" and the complementary data DATA_c of logic "1" may be provided.

Below, first, the timing diagram of signals will be described under assumption that the first column corresponds to a selected column. Since the first column is selected, the column selection signal Wcol[0] of logic "0" may be provided to the first write driver 130_1a from a column decoder (not illustrated). The first NOR logic NR1 may logically combine the provided signals to output the first true assist selection signal AS_s1t of logic "1." The second NOR logic NR2 may logically combine the provided signals to output the first complementary assist selection signal AS_s1c of logic "0." As described with reference to FIG. 5, by the first true assist selection signal AS_s1t of logic "1," the first supply voltage VDA1 of the first write assist circuit 140_1a may become the write assist voltage lower than the cell voltage VDDA by the delta voltage ΔV. The write assist voltage may be provided to the first memory cell 110_1.

The fourth NMOS transistor N4 may be turned on according to the first true assist selection signal AS_s1t of logic "1," and thus, a voltage of the first bit line BL1 may be discharged to the ground voltage GND. The fifth NMOS transistor N5 may be turned off according to the first complementary assist selection signal AS_s1c of logic "0," and thus, a precharged voltage level of the first complementary bit line BL1B may be maintained. Next, a voltage of the first bit line BL1 may be transferred to the node a, and a voltage of the first complementary bit line BL1B may be transferred to the node b. The first and second inverters I1 and I2 of the first memory cell 110_1 may develop the voltages of the nodes a and b. The developing process may be completed before t1. As a result, during the write operation, the first memory cell 110_1 may be driven with the write assist voltage from t0 to t1.

At a time point t1, the enable bar signal AS_enb may transition to logic "0." Accordingly, the first supply voltage VDA1 of the first write assist circuit 140_1a may transition to the cell voltage VDDA again. The cell voltage VDDA may be provided to the first memory cell 110_1. From t1 to t2, the first memory cell 110_1 may maintain the written data.

After the time point t2, a word line voltage of logic "0" may be provided to the word line WL. The first memory cell 110_1 may be isolated from the first bit line pair BL1 and BL1B. In this case, the first column may not be selected, and the column selection signal Wcol[0] of logic "1" may be provided. Also, the true data DATA_t of logic "1" and the complementary data DATA_c of logic "1" may be provided. Accordingly, each of the first true assist selection signal AS_s1t and the first complementary assist selection signal AS_s1c may be set to logic "0." In this case, since the fourth and fifth NMOS transistors N4 and N5 are turned off, the first bit line BL1 and the first complementary bit line BL1B may be floated. Although not illustrated, a voltage of each of the first bit line BL1 and the first complementary bit line BL1B may go to a voltage of logic "1" again by a following precharge operation.

Hereinafter, the timing diagram of signals will be described under assumption that the first column corresponds to a half selected column. In the period t0 to t2, since the first column is not selected, the column selection signal Wcol[0] of logic "1" may be provided to the first write driver 130_1a from the column decoder (not illustrated). The first NOR logic NR1 may output the first true assist selection signal AS_s1t of logic "0" regardless of the true data DATA_t. The second NOR logic NR2 may output the first complementary assist selection signal AS_s1c of logic "0" regardless of the complementary data DATA_c. As described with reference to FIG. 6, the first supply voltage VDA1 of the first write assist circuit 140_1a may become the cell voltage VDDA. The cell voltage VDDA may be provided to the first memory cell 110_1. Also, the fourth and fifth NMOS transistors N4 and N5 may be respectively turned off by the first true and complementary assist selection signals AS_s1t and AS_s1c of logic "0." In this case, each of the first bit line BL1 and the first complementary bit line BL1B may be floated.

At a time point before t1, for example, a voltage of the node a of the first memory cell 110_1 may have a level of the ground voltage GND (corresponding to logic "0"), and a voltage of the node b may have a level of the cell voltage VDDA (corresponding to logic "1"). At a time point t1, the first and second pass gates PG1 and PG2 of the first memory cell 110_1 may be turned on by the word line voltage provided to the word line WL, and thus, the first memory cell 110_1 may be connected with the first bit line pair BL1 and BL1B. Since a voltage of the node a is transferred to the first bit line BL1, a voltage of the first bit line BL1 may have a level of the ground voltage GND. Since a voltage of the node b is transferred to the first complementary bit line BL1B, a voltage of the first complementary bit line BL1B may have a level of the cell voltage VDDA.

After the time point t2, the word line voltage of logic "0" may be provided to the word line WL. The first write assist circuit 140_1a may be isolated from the first bit line pair BL1 and BL1B. The first memory cell 110_1 may maintain voltages of the nodes a and b. A voltage of each of the first bit line BL1 and the first complementary bit line BL1B may go to a voltage of logic "1" again by a following precharge operation. As a result, during the write operation, the first memory cell 110_1 that is connected with the half selected column may be driven with the cell voltage VDDA.

Figure 8:
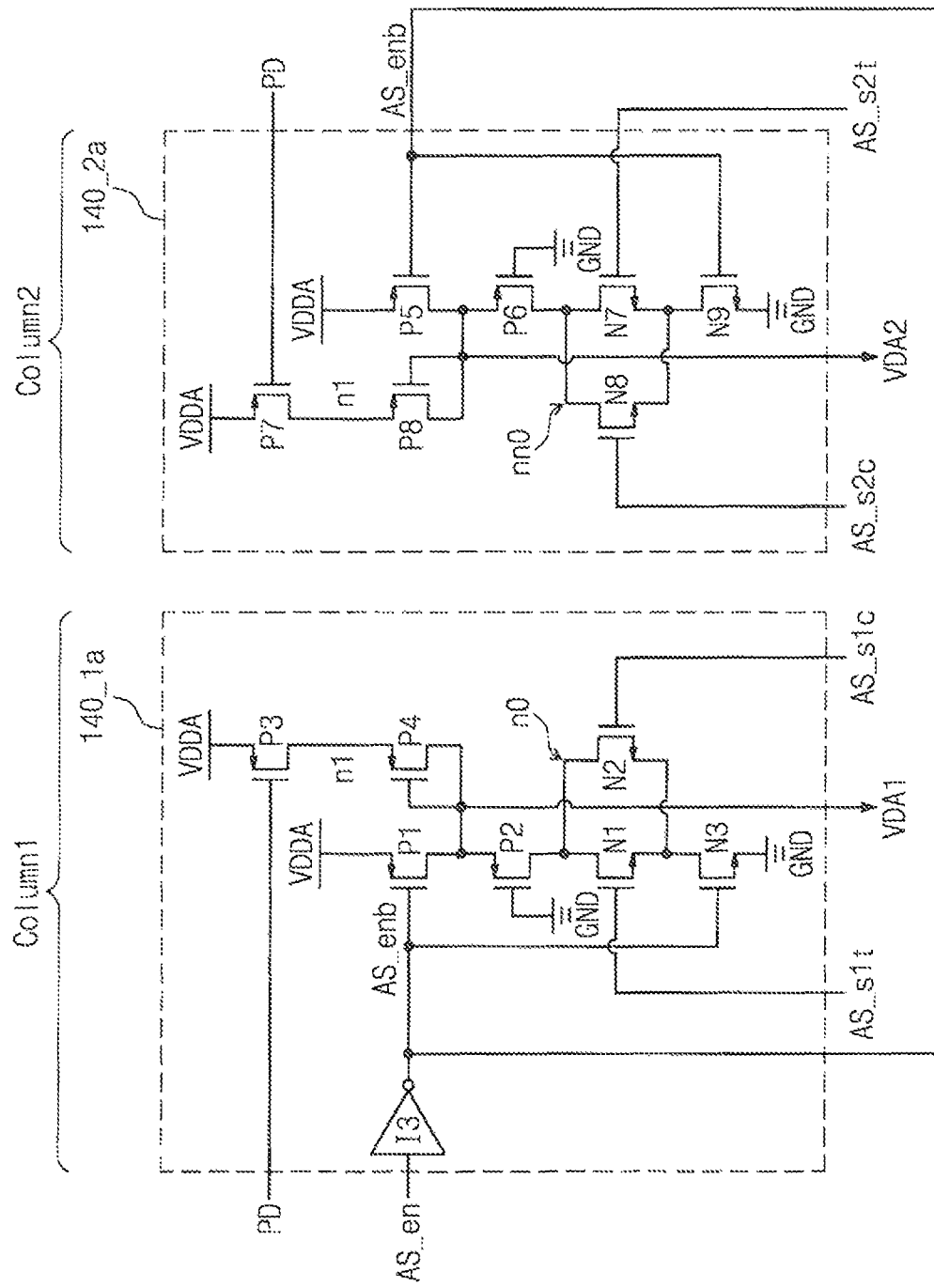
FIGS. 8 and 9 are views illustrating a layout of the first and second write assist circuits according to an embodiment of FIGS. 5 and 6.
Figure 9:
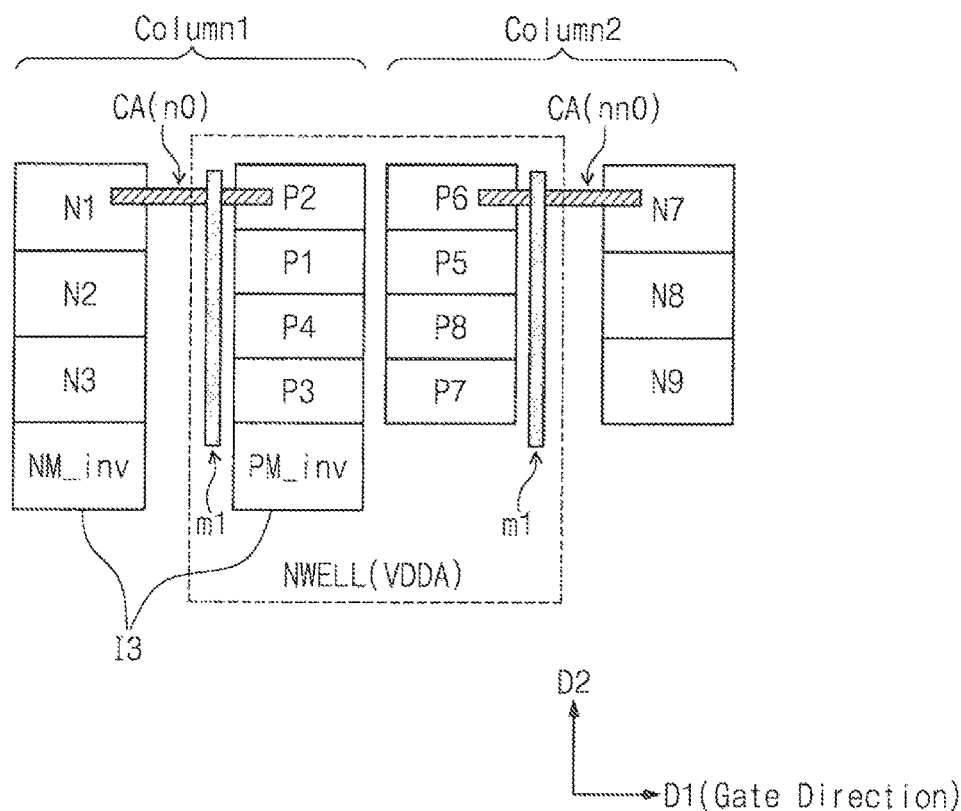

FIGS. 8 and 9 are views illustrating a layout of first and second write assist circuits according to embodiments of FIGS. 5 and 6. The first write assist circuit 140_1a and the second write assist circuit 140_2a are illustrated in FIG. 8. Configurations of the first write assist circuit 140_1a and the second write assist circuit 140_2a are substantially the same as described with reference to FIGS. 4 to 7. As described with reference to FIG. 5, the second write assist circuit 140_2a may be provided with the enable bar signal AS_enb from the third inverter I3 of the first write assist circuit 140_1a. The first write assist circuit 140_1a may provide the first supply voltage VDA1 to the first memory cell 110_1 connected with the first column. The second write assist circuit 140_2a may provide the second supply voltage VDA2 to the second memory cell 110_2 connected with the second column. The fifth to eighth PMOS transistors P5 to P8 of the second write assist circuit 140_2a may operate the same or similarly as the first to fourth PMOS transistors P1 to P4, respectively, of the first write assist circuit 140_1a. The seventh to ninth NMOS transistors N7 to N9 of the second write assist circuit 140_2a may operate the same or similarly as the first to third NMOS transistors N1 to N3, respectively, of the first write assist circuit 140_1a, as described herein.

A layout of the first write assist circuit 140_1a and the second write assist circuit 140_2a is illustrated in FIG. 9. Transistors illustrated in FIG. 9 are formed on a substrate. Although not illustrated, an active area may be formed on the substrate. The active area may include source and drain areas and channel areas for forming a transistor. For example, the substrate may be a silicon substrate, a germanium substrate, or a silicon on insulator (SOI) substrate. In FIG. 9, gates of the transistors may be formed on the substrate along a direction D1. Here, a direction in which a gate is formed is referred to as a "D1 direction." Also, a direction that is perpendicular to the D1 direction is referred to as a "D2 direction." This is only an example, and the D2 direction may be any direction that crosses the D1 direction.

In FIG. 9, an arrangement order of first to fourth PMOS transistors P1 to P4 and an arrangement order of first to third NMOS transistors N1 to N3 are only an example embodiment. Also, an arrangement order of fifth to eighth PMOS transistors P5 to P8 and an arrangement order of seventh to ninth NMOS transistors N7 to N9 are only an example embodiment.

Hereinafter, a layout will be described with reference to FIG. 9. The first, second, and third NMOS transistors N1, N2, and N3 may be disposed in an area where the first column is disposed, along a direction opposite to the D2 direction. Also, an inverter NMOS transistor NM_inv constituting the third inverter I3 may be disposed adjacent to the third NMOS transistor N3 in a direction opposite to the D2 direction.

An N-well NWELL for forming a PMOS transistor may be formed on the substrate so as to be spaced apart from the NMOS transistors N1 to N3 and NM_inv in the D1 direction. The second, first, fourth, and third PMOS transistors P2, P1, P4, and P3 may be disposed in an area, in which the first column in the N-well NWELL is disposed, along a direction opposite to the D2 direction. Also, an inverter PMOS transistor PM_inv constituting the third inverter I3 may be disposed adjacent to the third PMOS transistor P3 in a direction opposite to the D2 direction.

The first NMOS transistor N1 may be connected with the second PMOS transistor P2 through a node n0 (refer to FIG. 8) along the D1 direction. At least part of the node n0 may be formed with a contact area CA. The contact area CA may be formed in a layer different from a first metal m1. A location where the contact area CA is formed will be more fully described with reference to FIG. 10. The node n0 formed with the contact area CA may not be connected with the first metal m1. Accordingly, the complexity to arrange the first metal m1 may decrease.

The sixth, fifth, eighth, and seventh PMOS transistors P6, P5, P8, and P7 may be disposed in an area, in which the second column in the N-well NWELL is disposed, along a direction opposite to the D2 direction. The seventh to ninth NMOS transistors N7 to N9 may be disposed in a direction opposite to the D2 direction so as to be spaced apart from the PMOS transistors P5 to P8 in the D1 direction.

The seventh NMOS transistor N7 may be connected with the sixth PMOS transistor P6 through a node nn0 (refer to FIG. 8) along the D1 direction. At least part of the node nn0 may be formed with a contact area CA. As described above, the node nn0 formed with the contact area CA may not be connected with the first metal m1.

In the layout of FIG. 9, one N-well NWELL is formed on the substrate such that the PMOS transistors P1 to P8 and PM_inv are disposed therein. Accordingly, it may be possible to minimize a distance from an NMOS transistor in order that the N-well NWELL may be formed normally. Also, in FIG. 9, transistors are disposed in an order of an area for NMOS transistors, an area or PMOS transistors, and an area for NMOS transistors. Accordingly, other columns that are not illustrated may be also disposed toward both sides of the layout of FIG. 9 (the D1 direction or a direction opposite to the D1 direction). As a result, a layout area of the first and second write assist circuits 140_1a and 140_2a may be minimized.

Figure 10:
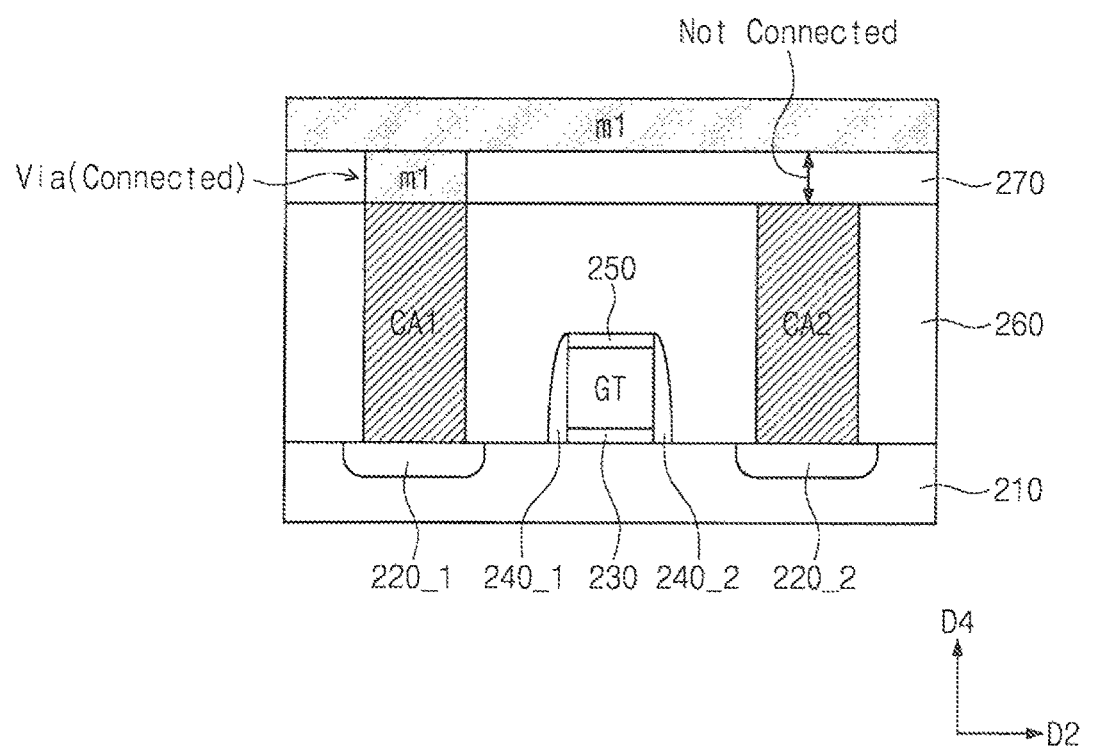
FIG. 10 is a view for describing a contact area illustrated in FIG. 9.

FIG. 10 is a view for describing a contact area illustrated in FIG. 9. First, a gate GT may be formed on a substrate 210. First and second source/drain areas 220_1 and 220_2 may be formed in the substrate 210 of both sides of the gate GT. Although not illustrated, a channel may be formed between the first and second source/drain areas 220_1 and 220_2 in the substrate 210. The gate GT, the first and second source/drain areas 220_1 and 220_2, and the channel may constitute one transistor.

A gate insulating layer 230 may be formed between the gate GT and the substrate 210. First and second spacers 240_1 and 240_2 may be formed on both side surfaces of the gate GT. A capping layer 250 may be formed on the gate GT. A first interlayer insulating layer 260 may be formed on the substrate 210 to surround the gate insulating layer 230, the first and second spacers 240_1 and 240_2, and the capping layer 250. For example, each of the gate insulating layer 230, the first and second spacers 240_1 and 240_2, the capping layer 250, and the first interlayer insulating layer 260 may be formed of an insulating material.

The first and second contact areas CA1 and CA2 may be formed to cross the first interlayer insulating layer 260 in a direction D4. In some embodiments, the direction D4 may cross both the direction D1 and D2. The first contact area CA1 may be directly or indirectly connected with the first source/drain area 220_1, and the second contact area CA2 may be directly or indirectly connected with the second source/drain area 220_2. For example, each of the first and second contact areas CA1 and CA2 may be formed of a conductive material.

The second interlayer insulating layer 270 may be formed on the first interlayer insulating layer 260. The first metal m1 may be formed in the second interlayer insulating layer 270 in a direction D2 which crosses the direction D4. A via may be formed in a direction opposite to the D4 direction so as to be connected with the first metal m1. The first contact area CA1 may be connected with a layer of the first metal m1 through the via. However, a via for connection with the second contact area CA2 may not be formed. Accordingly, the second contact area CA2 may not be connected with the first metal m1.

In FIG. 9, at least part of each of the nodes n0 and nn0 may include the contact area CA. However, the nodes n0 and nn0 may be spaced apart from the first metal m1. Accordingly, the contact area CA may be formed substantially the same as the contact area CA2, at an area where the nodes n0 and nn0 cross the first metal m1. As a result, the nodes n0 and nn0 may not be connected with the first metal m1.

Figure 11:
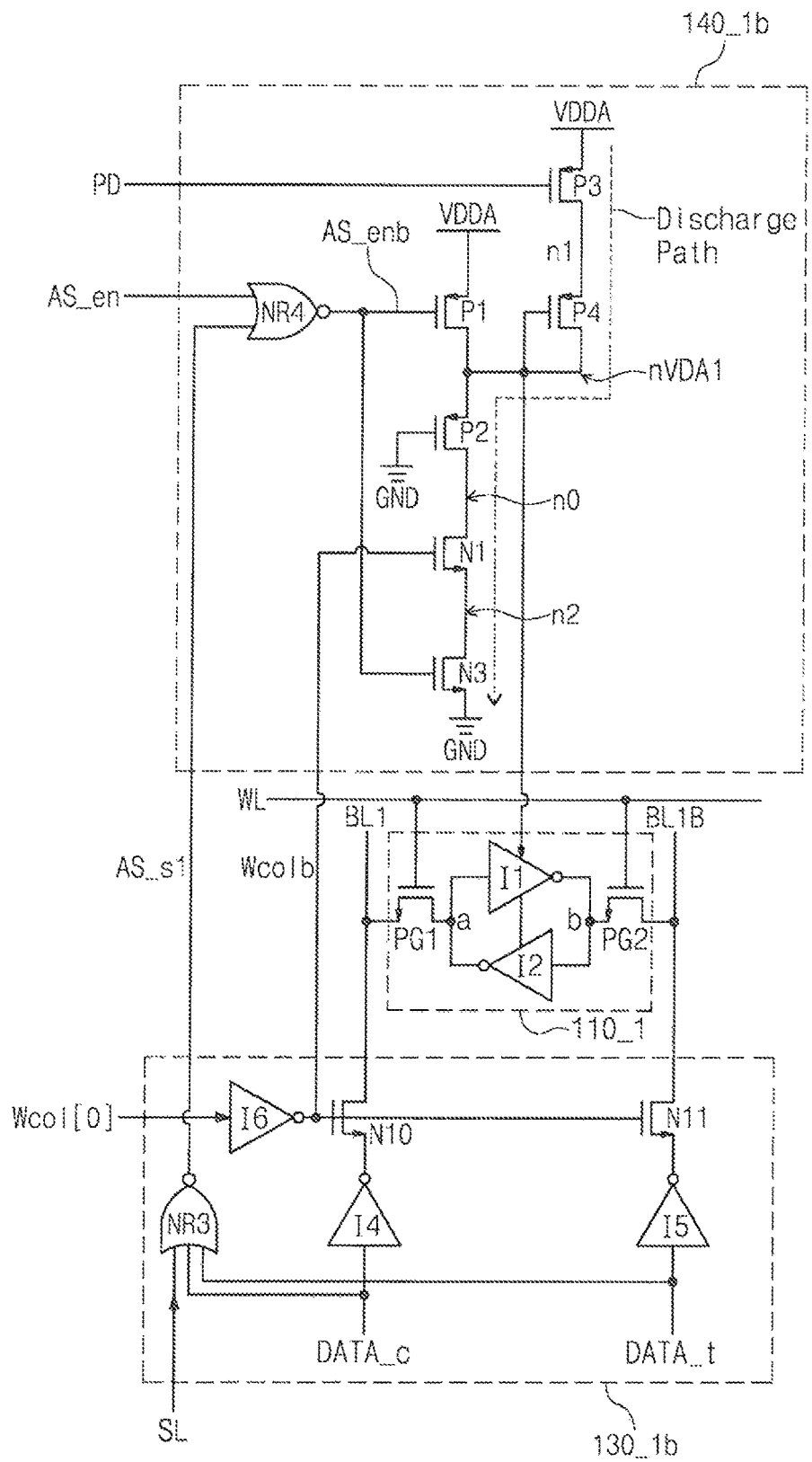
FIGS. 11 and 12 are views illustrating a configuration and an operation of the first write assist circuit illustrated in FIG. 4, according to another embodiment of the inventive concepts.
Figure 12:
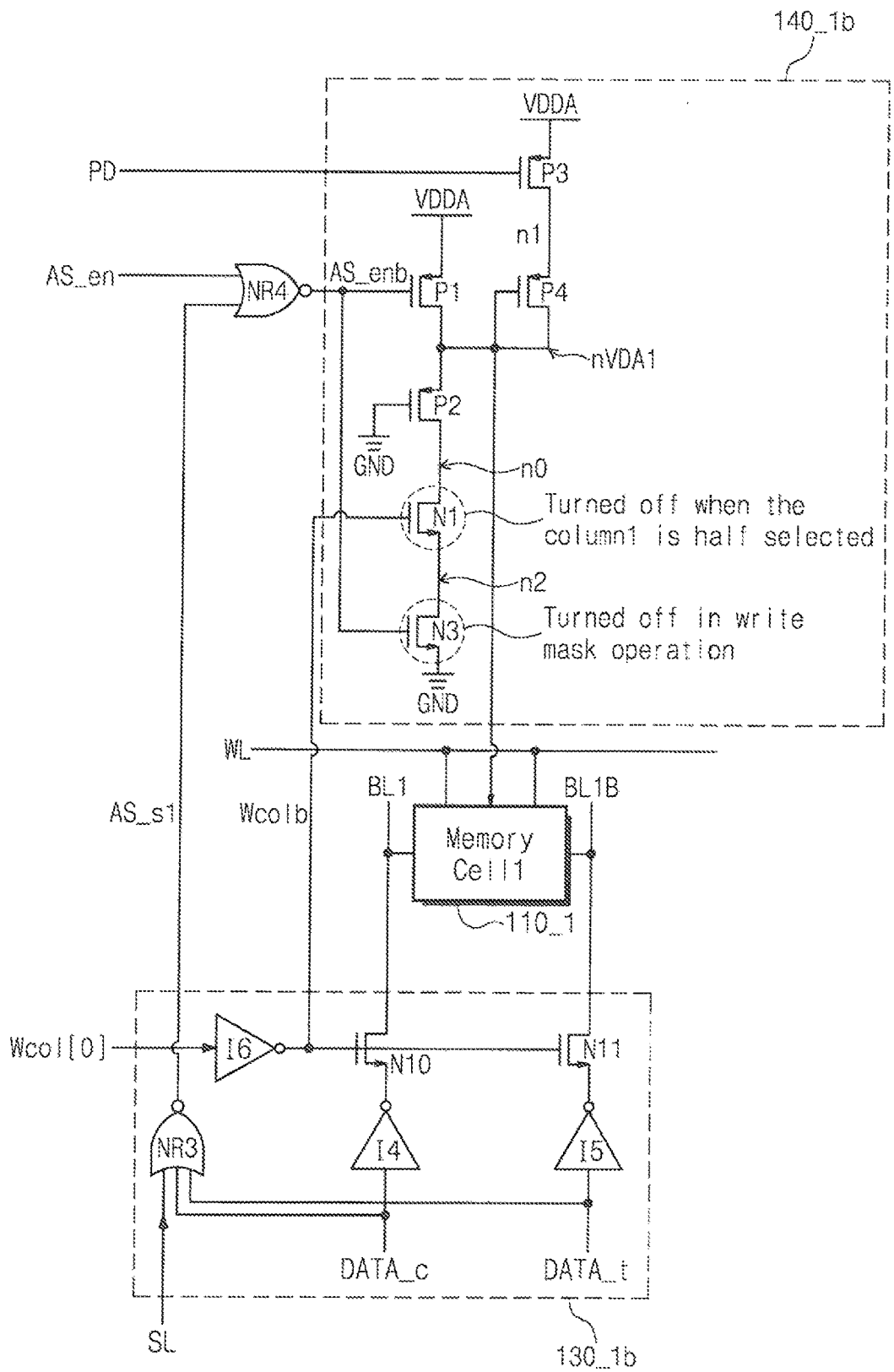

FIGS. 11 and 12 are views illustrating a configuration and an operation of a first write assist circuit illustrated in FIG. 4, according to another embodiment of the inventive concepts. An example configuration of a first write driver 130_1b will be described prior to describing a first write assist circuit 140_1b. A configuration and an operation of the second write driver 130_2b is substantially the same as a configuration and an operation of the first write driver 130_1b.

The first write driver 130_1b may include fourth to sixth inverters I4 to I6, a third NOR logic NR3, and tenth and eleventh NMOS transistors N10 and N11. The fourth inverter I4 may invert complementary data DATA_c and may output the inverted result to one end of the tenth NMOS transistor N10. That is, the fourth inverter I4 may output a signal corresponding to true data DATA_t. The fifth inverter I5 may invert the true data DATA_t and may output the inverted result to one end of the eleventh NMOS transistor N11. That is, the fifth inverter I5 may output a signal corresponding to the complementary data DATA_c.

The sixth inverter I6 may invert the column selection signal Wcol[0] and may output the inverted result as the column selection bar signal Wcolb. The column selection bar signal Wcolb may be provided to gates of the tenth and eleventh NMOS transistors N10 and N11 and the first write assist circuit 140_1b.

The tenth NMOS transistor N10 may be connected between the first bit line BL1 and an output of the first inverter I1. The tenth NMOS transistor N10 may be turned on or off according to the column selection bar signal Wcolb such that the output of the fourth inverter I4 is selectively supplied to the first bit line BL1. In the case where the first column is not selected, the column selection signal Wcol[0] of logic "1" may be provided. The sixth inverter I6 may output the column selection bar signal Wcolb of logic "0." In this case, the tenth NMOS transistor N10 may be turned off, and thus, the first bit line BL1 may be floated. Accordingly, the output (i.e., the true data DATA_t) of the fourth inverter I4 may not be transferred to the first bit line BL1.

In the case where the first column is selected, the column selection signal Wcol[0] of logic "0" may be provided. The tenth inverter I10 may output the column selection bar signal Wcolb of logic "1." Since the tenth NMOS transistor N10 may be turned on by the column selection bar signal Wcolb of logic "1," the first bit line BL1 may be connected with the output of the fourth inverter I4. Accordingly, the output (i.e., the time data DATA_t) of the fourth inverter I4 may be transferred to the first bit line BL1.

The eleventh NMOS transistor N11 may be connected between the first complementary bit line BL1B and an output of the fifth inverter I5. In response to the column selection bar signal Wcolb, the eleventh NMOS transistor N11 may selectively provide an output signal of the fifth inverter I5 to the first complementary bit line BL1B. A process in which the output (i.e., the complementary data DATA_c) of the fifth inverter I5 is transferred to the first complementary bit line BL1B by the fifth and sixth inverters I5 and I6 and the eleventh NMOS transistor N11 is substantially the same as the process performed through the fourth and sixth inverters I4 and I6 and the tenth NMOS transistor N10.

A signal SL of logic "1" may be provided in a power-down mode. Although not illustrated in FIG. 4, the first write driver 130_1b of FIGS. 11 and 12 may be further provided with the signal SL. The signal SL may be provided from a controller (not illustrated). The signal SL of logic "0" may be provided during an operation such as a read operation or a write operation. Hereinafter, it is assumed that the signal SL of logic "0" is provided.

The third NOR logic NR3 may perform a NOR operation on the true data DATA_t, the complementary data DATA_c, and the signal SL to output a first assist selection signal AS_s1. In the case where data are written in the first memory cell 110_1, the true data DATA_t or the complementary data DATA_c may have logic "1." Accordingly, the first assist selection signal AS_s1 may have logic "0" while data are written in the first memory cell 110_1.

Herein, a configuration and an operation of the first write assist circuit 140_1b will be described. The first write assist circuit 140_1b may include first to fourth PMOS transistors P1 to P4, first and third NMOS transistors N1 and N3, and a fourth NOR logic NR4. The first PMOS transistor P1 may be connected between the cell voltage VDDA and the node nVDA1. The first PMOS transistor P1 may be turned on or off by the enable bar signal AS_enb that is an output of the fourth NOR logic NR4. The second PMOS transistor P2 may be connected between the node nVDA1 and the node n0. A gate of the second PMOS transistor P2 may be connected with the ground voltage GND so as to be turned on always.

The third PMOS transistor P3 may be connected between the cell voltage VDDA and the node n1. The third PMOS transistor P3 may be turned on or off according to the power-down signal PD. The fourth PMOS transistor P4 may be connected between the node n1 and the node nVDA1. One end of the fourth PMOS transistor P4 may be connected with a gate thereof and the node nVDA1. The first NMOS transistor N1 may be connected between the node n0 and the node n2. The first NMOS transistor N1 may be turned on or off according to the column selection bar signal Wcolb. The third NMOS transistor N3 may be connected between the node n2 and the ground voltage GND. The third NMOS transistor N3 may be turned on or off according to the enable bar signal AS_enb.

The fourth NOR logic NR4 may perform a NOR operation on the first assist selection signal AS_s1 and the enable signal AS_en. As described herein, the first assist selection signal AS_s1 may have logic "0" while data are written in the first memory cell 110_1. Accordingly, during the data write operation, the fourth NOR logic NR4 may invert the enable signal AS_en to output the enable bar signal AS_enb.

FIG. 11 shows an operation of the first write assist circuit 140_1b when the first column is selected by the column selection signal Wcol[0]. The power-down signal PD and the enable signal AS_en may be input to be the same as described with reference to FIG. 2. In the case where the first column is selected, the column selection signal Wcol[0] of logic "0" may be provided. The sixth inverter I6 may output the column selection bar signal Wcolb of logic "1." The third NOR logic NR3 may perform a NOR operation on the true data DATA_t, the complementary data DATA_c, and the signal SL. The third NOR logic NR3 may output the first assist selection signal AS_s1 of logic "0."

For example, it is assumed that the true data DATA_t is logic "0" and the complementary data DATA_c is logic "1." The fourth inverter I4 may output logic "0." The fifth inverter I5 may output logic "1." Before data are written, the first bit line BL1 and the first complementary bit line BL1B may be precharged with a voltage of logic "1." The tenth and eleventh NMOS transistors N10 and N11 may be turned on by the column selection bar signal Wcolb of logic "1." A voltage of logic "0" that is an output of the fourth inverter I4 may be provided to the first bit line BL1. A voltage of logic "1" that is an output of the fifth inverter I5 may be provided to the first complementary bit line BL1B. If a word line voltage is applied to the word line WL, the first memory cell 110_1 may store data defined by voltages of the first bit line BL1 and the first complementary bit line BL1B.

In a partial period of a data write process, the first write assist circuit 140_1b may provide the write assist voltage to the first memory cell 110_1. A process in which the write assist voltage is generated by the first write assist circuit 140_1b is as follows.

The fourth NOR logic NR4 may perform a NOR operation on the first assist selection signal AS_s1 of logic "0" and the enable signal AS_en of logic "0." The fourth NOR logic NR4 may output the enable bar signal AS_enb of logic "1." By the enable bar signal AS_enb, the first PMOS transistor P1 is turned off, and the third NMOS transistor N3 is turned on. The first NMOS transistor N1 is turned on by the column selection bar signal Wcolb of logic "1." The third PMOS transistor P3 is turned on by the power-down signal PD of logic "0." As a result, a discharge path from the cell voltage VDDA to the ground voltage GND is formed through the third, fourth, and second PMOS transistors P3, P4, and P2 and the first and third NMOS transistors N1 and N3. A voltage of the node nVDA1 decreases to a voltage lower than the cell voltage VDDA by the delta voltage through the formed discharge path.

The decreased voltage is provided to the first memory cell 110_1 through the node nVDA1 as the write assist voltage.

An operation of a second write assist circuit 140_2b is substantially the same as the operation of the first write assist circuit 140_1b.

FIG. 12 shows an operation of the first write assist circuit 140_1b when the first column corresponds to the half selected column. Since the first column is not selected, the column selection signal Wcol[0] of logic "1" may be provided. The sixth inverter I6 may output the column selection bar signal Wcolb of logic "0." The first NMOS transistor N1 may be turned off by the column selection bar signal Wcolb of logic "0."

Since the first NMOS transistor N1 is turned off, a discharge path from the cell voltage VDDA to the ground voltage GND may not be formed. As a result, a voltage of the node nVDA1 may not decrease. The node nVDA1 may be maintained with the cell voltage VDDA set before the first column is half-selected. That is, in the case where the first column is half-selected, the first write assist circuit 140_1b may provide the first memory cell 110_1 with the cell voltage VDDA, not the write assist voltage.

How the first write driver 130_1b and the first write assist circuit 140_1b operate when a write mask operation is performed will be described. In the case where the first write driver 130_1b performs the write mask operation, the column selection signal Wcol[0] of logic "0" may be provided because the first column is selected. The true data DATA_t of logic "0" and the complementary data DATA_c of logic "0" may be provided. The signal SL of logic "0" may be provided. Accordingly, the third NOR logic NR3 may perform a NOR operation on three inputs of logic "0" to output the first assist selection signal AS_s1 of logic "1." That is, the fourth NOR logic NR4 may output the enable bar signal AS_enb of logic "0" regardless of the enable signal AS_en.

The first PMOS transistor P1 may be turned on by the enable bar signal AS_enb of logic "0." The third NMOS transistor N3 may be turned off according to the enable bar signal AS_enb of logic "0." Since the third NMOS transistor N3 is turned off, a discharge path from the cell voltage VDDA to the ground voltage GND may not be formed. As a result, the node nVDA1 may be maintained with the cell voltage VDDA without voltage drop. That is, in the write mask operation, the first write assist circuit 140_1b may provide the first memory cell 110_1 with the cell voltage VDDA, not the write assist voltage. Accordingly, the first memory cell 110_1 may stably maintain data stored therein.

Figures 13, 14:
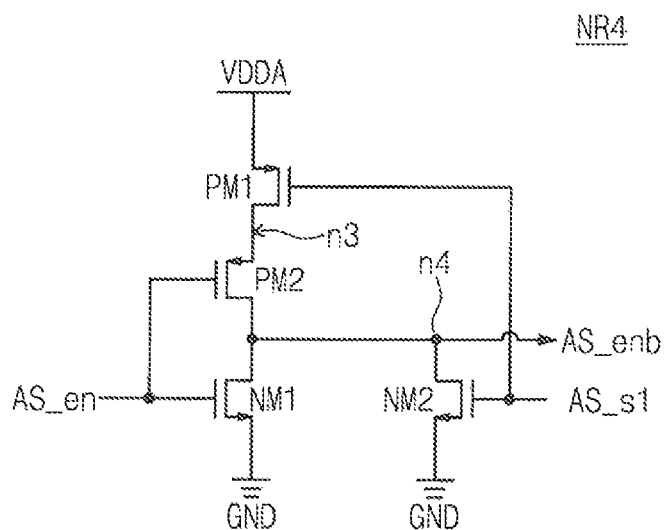
FIGS. 13 and 14 are views for describing a configuration of fourth NOR logic illustrated in FIGS. 11 and 12.

FIGS. 13 and 14 are views for describing a configuration of fourth NOR logic NR4 illustrated in FIGS. 11 and 12. The fourth NOR logic NR4 may be designed in consideration of voltage levels of the enable signal AS_en and the first assist selection signal AS_s1.

For example, the static random access memory device 100 of FIG. 4 may perform a DVFS (Dynamic Voltage Frequency Scaling) operation. DVFS is a technology for reducing power consumption by changing an operating speed and a driving voltage of the static random access memory device 100 based on a workload of a host (not illustrated) and the static random access memory device 100.

Voltages of signals AS_en and AS_s1 associated with the DVFS operation and the cell voltage VDDA are exemplified in FIG. 14. The enable signal AS_en and the first assist selection signal AS_s1 may be provided from the first write driver 130_1a. The first write driver 130_1a may be driven with a voltage, which is different from the cell voltage VDDA in level. Through the DVFS operation, a driving voltage of the first write driver 130_1a may be different from the cell voltage VDDA. Accordingly, voltage of logic "1" of at least one of the enable signal AS_en and the first assist selection signal AS_s1 generated by the first write driver 130_1a may be different from the cell voltage VDDA. For example, as illustrated in FIG. 14, a voltage of logic "1" of each of the enable signal AS_en and the first assist selection signal AS_s1 may become lower than the cell voltage VDDA.

Returning to FIG. 13, a configuration of the fourth NOR logic NR4 may be as follows. A first PMOS transistor PM1 may be connected between the cell voltage VDDA and a node n3. The first PMOS transistor PM1 may be turned on or off according to the first assist electron signal AS_s1. A second PMOS transistor PM2 is connected between the node n3 and a node n4. The second PMOS transistor PM2 may be turned on or off according to the enable signal AS_en. First and second NMOS transistors NM1 and NM2 may be connected in parallel between the node n4 and the ground voltage GND. The first NMOS transistor NM1 may be turned on or off according to the enable signal AS_en. The second NMOS transistor NM2 may be turned on or off according to the first assist selection signal AS_s1.

The fourth NOR logic NR4 may output a voltage of the node n4 as the enable bar signal AS_enb. A voltage of the node n4 corresponding to logic "0" may be formed when the first NMOS transistor NM1 or the second NMOS transistor NM2 is turned on. However, in the case where voltage levels of the enable signal AS_en and the first assist selection signal AS_s1 are lower in level than the cell voltage VDDA, the first and second PMOS transistors PM1 and PM2 may not be fully turned off. Also, the first and second NMOS transistors NM1 and NM2 may not be fully turned on.

For this reason, in an example of FIG. 14, according to an embodiment of the inventive concepts, the fourth NOR logic NR4 may be designed such that the drivability of the first and second NMOS transistors NM1 and NM2 are larger than or equal to that of the first and second PMOS transistors PM1 and PM2. Accordingly, even in the case where voltages of input signals are lower than the cell voltage VDDA, the fourth NOR logic NR4 may output a voltage of logic "0" stably.

Figure 15:
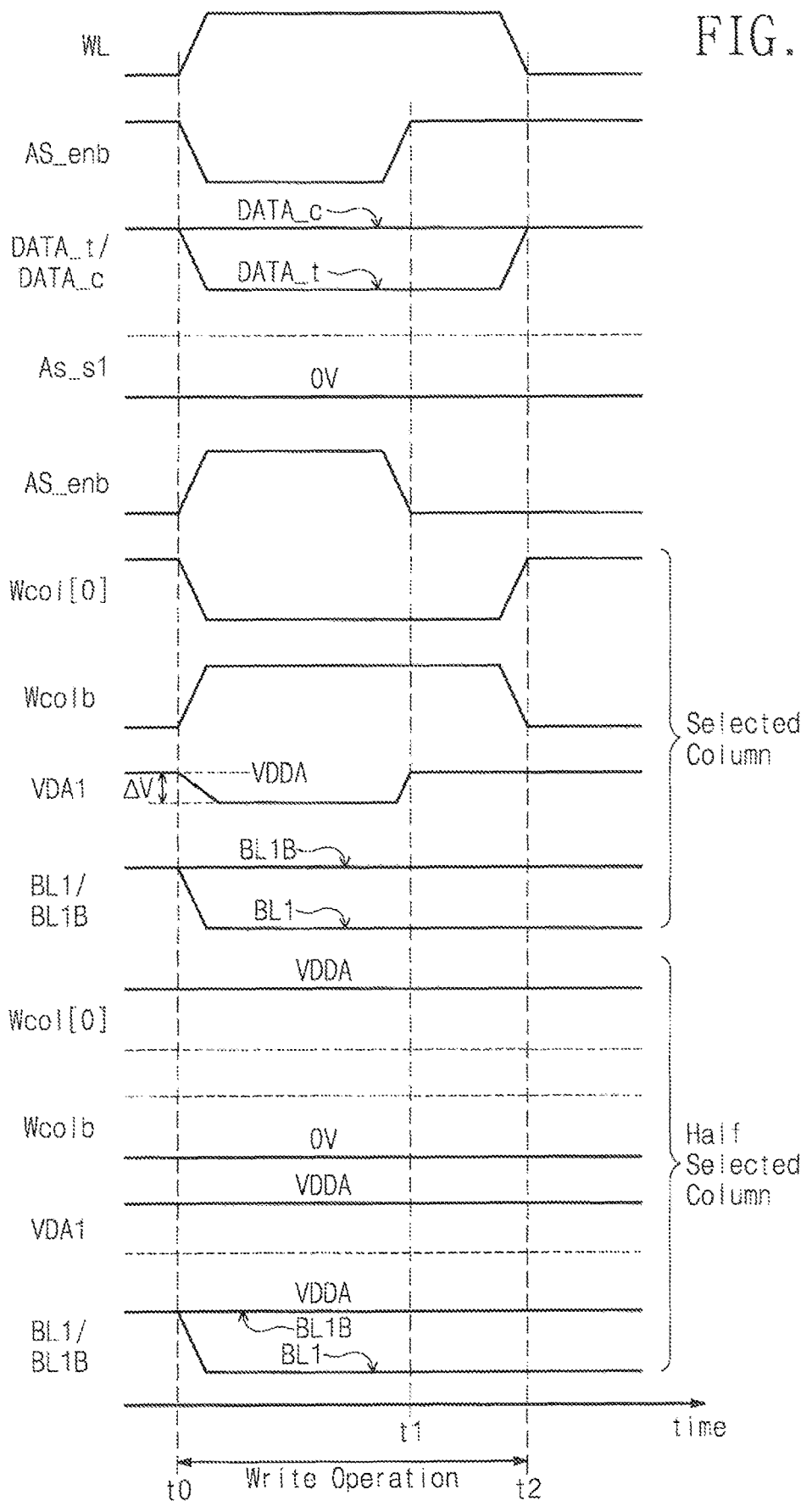
FIG. 15 is a timing diagram for describing an operation of the first write assist circuit illustrated in FIGS. 11 and 12.

FIG. 15 is a timing diagram for describing an operation of a first write assist circuit 140_1b illustrated in FIGS. 11 and 12. FIG. 15 will be described with reference to FIGS. 11 and 12. Referring to FIG. 15, the first write driver 130_1b and the first write assist circuit 140_1b may perform a write operation in a period from t0 to t2.

In a period from t0 to t1, a word line voltage of logic "1" may be provided to the word line WL. Next, the enable signal AS_en of logic "0" may be provided. Also, the true data DATA_t of logic "0" and the complementary data DATA_c of logic "1" may be provided. The third NOR logic NR3 outputs the first assist selection signal AS_s1 of logic "0". The fourth NOR logic NR4 performs a NOR operation on the enable signal AS_en and the first assist selection signal AS_s1 to output the enable bar signal AS_enb of logic "1." By the enable bar signal AS_enb of logic "1," the first PMOS transistor P1 is turned off, and the third NMOS transistor N3 is turned on.

The timing diagram of signals will be described herein under assumption that the first column corresponds to a selected column. Since the first column is selected, the column selection signal Wcol[0] of logic "0" may be provided to the first write driver 130_1b from a column decoder (not illustrated). The sixth inverter I6 may output the column selection bar signal Wcolb of logic "1." As described with reference to FIG. 11, by the column selection bar signal Wcolb of logic "1," the first supply voltage VDA1 of the first write assist circuit 140_1b is the write assist voltage lower than the cell voltage VDDA by the delta voltage ΔV. The write assist voltage is provided to the first memory cell 110_1.

Also, the tenth, and eleventh NMOS transistors N10 and N11 may be turned on by the column selection bar signal Wcolb of logic "1." Afterwards, a voltage of logic "0" output from the fourth inverter I4 may be provided to the first bit line BL1, and a voltage of logic "1" output from the fifth inverter I5 may be provided to the first complementary bit line BL1B. A voltage of the first bit line BL1 may be transferred to the node a, and a voltage of the first complementary bit line BL1B may be transferred to the node b. First and second inverters I1 and I2 of the first memory cell 110_1 may develop the voltages of the nodes a and b. The developing process may be completed before t1.

At a time point t1, the enable bar signal AS_enb may transition to logic "0." By the enable bar signal AS_enb, the first PMOS transistor P1 may be turned on, and the third NMOS transistor N3 may be aimed off. Accordingly, the first supply voltage VDA1 of the first write assist circuit 140_1b may transition to the cell voltage VDDA again. The cell voltage VDDA may be provided to the first memory cell 110_1. From t1 to t2, the first memory cell 110_1 may maintain the written data.

After the time point t2, the word line voltage of logic "0" may be provided to the word line WL. Since the first and second pass gates PG1 and PG2 are turned off by the word voltage of logic "0," the first memory cell 110_1 may be isolated from the first bit line pair BL1 and BL1B. Also, each of the true data DATA_t and the complementary data DATA_c may have logic "1."

The first column is not selected, and the column selection signal Wcol[0] of logic "1" is provided. The column selection bar signal Wcolb may be logic "0." In this case, the tenth and eleventh NMOS transistors N10 and N11 may be turned off, and thus, the first bit line BL1 and the first complementary bit line BL1B may be floated. Although not illustrated, a voltage of each of the first bit line BL1 and the first complementary bit line BL1B may go to a voltage of logic "1" again by a following precharge operation. As a result, during the write operation, the first memory cell 110_1 may be driven with the write assist voltage from t0 to t1.

Hereinafter, the timing diagram of signals will be described under assumption that the first column corresponds to a half selected column. In the period t0 to t1, since the first column is not selected, the column selection signal Wcol[0] of logic "1" may be provided to the first write driver 130_1b from the column decoder (not illustrated). The sixth inverter I6 may output the column selection bar signal Wcolb of logic "0." As described with reference to FIG. 12, the first supply voltage VDA1 of the first write assist circuit 140_1b may be the cell voltage VDDA. The cell voltage VDDA may be provided to the first memory cell 110_1. Also, the tenth and eleventh NMOS transistors N10 and N11 may be turned off by the column selection bar signal Wcolb of logic "0," and thus, the first bit line BL1 and the first complementary bit line BL1B may be floated.

At a time point before t1, for example, a voltage of the node a of the first memory cell 110_1 may have a level of the ground voltage GND (corresponding to logic "0"), and a voltage of the node b may have a level of the cell voltage VDDA (corresponding to logic "1"). As described with reference to FIG. 7, at the time point t1, since a voltage of the node a is transferred to the first bit line BL1, a voltage of the first bit line BL1 may have a level of the ground voltage GND. Since a voltage of the node b is transferred to the first complementary bit line BL1B, a voltage of the first complementary bit line BL1B may have a level of the cell voltage VDDA.

After the time point t2, the word line voltage of logic "0" may be provided to the word fine WL. The first memory cell 110_1 may be isolated from the first bit line pair BL1 and BL1B. The first memory cell 110_1 may maintain voltages of the nodes a and b. A voltage of each of the first bit line BL1 and the first complementary bit line BL1B may transition to a voltage of logic "1" again by a precharge operation after the time point t2. As a result, during the write operation, the first memory cell 110_1 that is connected with the half selected column may be driven with the cell voltage VDDA.

Figure 16:
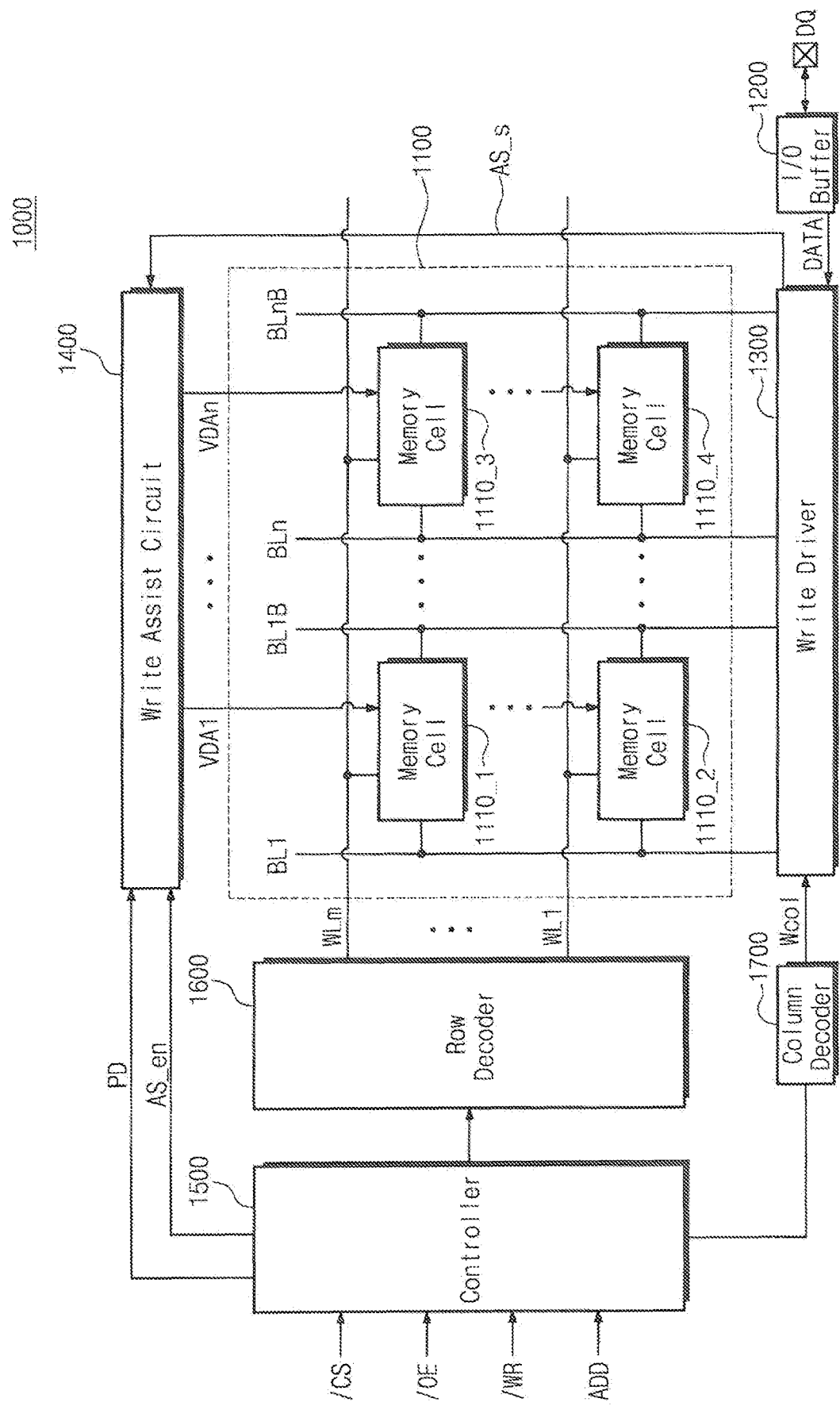
FIG. 16 is a block diagram illustrating a configuration of a static random access memory device according to another embodiment of the inventive concepts.

FIG. 16 is a block diagram illustrating a configuration of a static random access memory device according to another embodiment of the inventive concepts. Referring to FIG. 16, a static random access memory device 1000 may include a memory cell array 1100, an input/output buffer 1200, a write driver 1300, a write assist circuit 1400, a controller 1500, a row decoder 1600, and a column decoder 1700.

The memory cell array 1100 may include a plurality of memory cells 1110_1 to 1110_4 for storing data. For example, the plurality of memory cells 1110_1 to 1110_4 may include the first memory cell 11_1 or 110_1 and the second memory cell 11_2 or 110_2 described with reference to FIGS. 1 to 15. The plurality of memory cells 1110_1 to 1110_4 may be connected to a plurality of word lines and a plurality of bit line pairs. For example, the memory cells 1110_1 and 1110_2 may be connected with a first bit line pair BL1 and BL1B. Also, the memory cells 1110_3 and 1110_4 may be connected with an n-th bit line pair BLn and BLnB. The memory cells 1110_1 and 1110_3 may be selected by an m-th word line WLm, and the memory cells 1110_2 and 1110_4 may be selected by a first word line WL1.

The input/output buffer 1200 may be provided with data from a pad DQ. The input/output buffer 1200 may provide buffered data DATA to the write driver 1300. The input/output buffer 1200 may correspond to the input/output buffer 12 or 120 described with reference to FIGS. 1 and 4.

The write driver 1300 may be provided with the column selection signal Wcol from the column decoder 1700. Although not illustrated, the write driver 1300 may be provided with a column address from the column decoder 1700. The write driver 1300 may write data in a memory cell selected by the column selection signal Wcol and the column address. The write driver 1300 may provide a generated assist selection signal AS_s to the write assist circuit 1400. The write driver 1300 may include the write driver 130a, and/or 130b described with reference to FIGS. 4 to 15.

The static random access memory device 1000 according to an embodiment of the inventive concepts may include the write assist circuit 1400. The write assist circuit 1400 may provide a write assist voltage lower than the cell voltage VDDA to a memory cell, in which data are to be written, from among memory cells in a selected column. The write assist circuit 1400 may provide the cell voltage VDDA to a memory cell of a half selected column. That is, the write assist circuit 1400 may assist a write operation of a memory cell, which is connected to a selected column, from among the plurality of memory cells 1110_1 to 1110_4. The write assist circuit 1400 may include the write assist circuit 140a and/or 140b described with reference to FIGS. 4 to 15.

The controller 1500 may control overall operations of the static random access memory device 1000 in response to control signals /CS, /OE, and /WR and an address ADD of an external device (e.g., a host, a memory controller, and/or a memory interface). For example, the controller 1500 may control a read operation and a write operation of the static random access memory device 1000. The controller 1500 may generate the power-down signal PD and the enable signal AS_en based on the control signals /CS, /OE, and /WR and the address ADD. In the embodiment of FIGS. 11 to 15, the controller 1500 may further generate the signal SL. The controller 1500 may provide the write assist circuit 1400 with at least one of the power-down signal PD, the enable signal AS_en, and the signal SL (not illustrated). The controller 1500 may decode the address ADD. The controller 1500 may provide a decoded row address to the row decoder 1600 and a decoded column address to the column decoder 1700.

The row decoder 1600 may select one of a plurality of word lines WL1 to WLm in response to the row address. The column decoder 1700 may generate the column selection signal Wcol based on the decoded column address. The column selection signal Wcol may be provided to the write driver 1300. The column decoder 1700 may further provide the decoded column address to the write driver 1300.

A memory device according to an embodiment of the inventive concepts may include a write assist circuit that operates with respect to a selected column. According to an embodiment of the inventive concepts, a speed at which a write assist voltage is supplied may be improved, and power consumption may be reduced because an unnecessary write assist operation is removed.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees, or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been described with reference to embodiments herein, it will be apparent to those skilled in the art that various changes and modifications may be made without departing from the spirit and scope of the inventive concepts. Therefore, it should be understood that the above embodiments are not limiting, but illustrative.

What is claimed is:
1. A memory device comprising:
 a first write assist circuit configured to provide a cell voltage or a write assist voltage to a first memory cell connected with a first bit line pair;
 a first write driver configured to provide write data to the first memory cell through the first bit line pair;

a second write assist circuit configured to provide the cell voltage or the write assist voltage to a second memory cell connected with a second bit line pair; and a second write driver configured to provide the write data to the second memory cell through the second bit line pair, wherein one of the first write assist circuit and the second write assist circuit is configured to provide the write assist voltage in response to a column selection signal for selecting one write driver from among the first write driver and the second write driver, and the other of the first write assist circuit and the second write assist circuit is configured to provide the cell voltage in response to the column selection signal, wherein the first write assist circuit is configured to provide the cell voltage or the write assist voltage independently of voltages of the first bit line pair, wherein the first write assist circuit is configured to provide the cell voltage or the write assist voltage in response to an assist selection signal that is generated based on the column selection signal and the write data, wherein the assist selection signal includes a true assist selection signal and a complementary assist selection signal, wherein the true assist selection signal is generated based on the column selection signal and the write data, wherein the complementary assist selection signal is generated based on the column selection signal and complementary data of the write data, wherein the first write assist circuit includes:

a first transistor connected between the cell voltage and a node for outputting the cell voltage or the write assist voltage;

a second transistor connected between the node and a ground voltage and turned on or turned off according to the true assist selection signal; and a third transistor connected in parallel with the second transistor and turned on or turned off according to the complementary assist selection signal, and wherein one of the second transistor and the third transistor is turned on according to the true assist selection signal and the complementary assist selection signal such that the write assist voltage is formed at the node.

2. The memory device of claim 1, further comprising:
an input/output buffer connected with the first write driver and the second write driver respectively,
wherein one write driver, which is selected from among the first and second write drivers according to the column selection signal, is provided with the write data through the input/output buffer.

3. The memory device of claim 1, wherein the write assist voltage is lower than the cell voltage.

4. The memory device of claim 1, wherein each of the first write assist circuit and the second write assist circuit is further configured to provide the cell voltage in a write mask operation of the first write driver.

5. The memory device of claim 1, wherein the first write driver is further configured to generate the assist selection signal based on the column selection signal and the write data.

6. The memory device of claim 1,
wherein the true assist selection signal is generated based on the column selection signal and the write data, and
wherein the complementary assist selection signal is generated based on the column selection signal and complementary data of the write data.

7. The memory device of claim 1, wherein the first write assist circuit further includes:
a fourth transistor having one end connected in series with the first transistor between the cell voltage and the node, a gate, and an opposite end connected with the gate and the node, and
wherein the write assist voltage is lower than the cell voltage by a sum of a first source-drain voltage of the first transistor turned on and a second source-drain voltage of the fourth transistor turned on.

8. The memory device of claim 1, wherein the first write driver includes:
a fourth transistor configured to provide the write data to a first bit line of the first bit line pair in response to the true assist selection signal; and
a fifth transistor configured to provide the complementary data of the write data to a first complementary bit line of the first bit line pair in response to the complementary assist selection signal.

9. The memory device of claim 1, wherein the first write assist circuit and the second write assist circuit are electrically isolated from the first bit line pair.

10. The memory device of claim 1, wherein the first write assist circuit is further configured to provide the cell voltage or the write assist voltage in response to an assist selection signal that is generated independently of the voltages of the first bit line pair and based on a logical operation performed on the column selection signal and the write data.

11. A memory device comprising:
a first write assist circuit configured to provide a cell voltage or a write assist voltage to a first memory cell connected with a first bit line pair;
a first write driver configured to provide write data to the first memory cell through the first bit line pair;
a second write assist circuit configured to provide the cell voltage or the write assist voltage to a second memory cell connected with a second bit line pair; and
a second write driver configured to provide the write data to the second memory cell through the second bit line pair,
wherein one of the first write assist circuit and the second write assist circuit is configured to provide the write assist voltage in response to a column selection signal for selecting one write driver, which provides the write data, from among the first write driver and the second write driver, and the other of the first write assist circuit and the second write assist circuit is configured to provide the cell voltage in response to the column selection signal,
wherein the first write assist circuit includes:
a first transistor connected between the cell voltage and a node for outputting the cell voltage or the write assist voltage; and
a second transistor connected between the node and a ground voltage and turned on or turned off according to a complementary signal of the column selection signal,
wherein the second transistor is turned on according to the complementary signal of the column selection signal such that the write assist voltage is formed at the node.

12. The memory device of claim 11, wherein the first write assist circuit further includes:
a third transistor having one end connected in series with the first transistor between the cell voltage and the node, a gate, and an opposite end connected with the gate and the node,
wherein the write assist voltage is lower than the cell voltage by a sum of a first source-drain voltage of the first transistor turned on and a second source-drain voltage of the third transistor turned on.

13. The memory device of claim 11, wherein the first write driver includes:
a first inverter configured to transfer complementary data of the write data;
a second inverter configured to transfer the write data;
a fourth transistor configured to connect a first bit line of the first bit line pair with the first inverter in response to the complementary signal of the column selection signal; and
a fifth transistor configured to connect a first complementary bit line of the first bit line pair with the second inverter in response to the complementary signal of the column selection signal.

14. A memory device comprising:
a memory cell;
a write assist circuit configured to deliver a cell voltage or an assist voltage to the memory cell, wherein the assist voltage is smaller than the cell voltage; and
a write driver connected to the memory cell by a bit line pair, the write driver configured to receive a column selection signal to select whether to provide write data to the memory cell and, responsive to the column selection signal, generate an assist selection signal to the write assist circuit,
wherein, if the memory cell is selected to receive the write data by the column selection signal, the write assist circuit is configured to deliver the assist voltage to the memory cell, and, if the memory cell is not selected to receive the write data by the column selection signal, the write assist circuit is configured to deliver the cell voltage to the memory cell,
wherein the write assist circuit is electrically isolated from the bit line pair, and
wherein the write assist circuit is configured to deliver the cell voltage or the assist voltage in response to the assist selection signal and independently of voltages on the bit line pair,
wherein the assist selection signal includes a first assist selection signal and a second assist selection signal,
wherein the write assist circuit includes:
a first transistor connected between the cell voltage and a node for outputting the cell voltage or the assist voltage;
a second transistor connected between the node and a ground voltage and turned on or turned off according to the first assist selection signal; and
a third transistor connected in parallel with the second transistor and turned on or turned off according to the second assist selection signal, and
wherein one of the second transistor and the third transistor is turned on according to the first assist selection signal and the second assist selection signal such that the assist voltage is formed at the node.

15. The memory device of claim 14, wherein the write driver is configured to receive the write data for writing to the memory cell, and
wherein the write driver generates the assist selection signal based on the column selection signal and the write data.

16. The memory device of claim 15,
wherein the first assist selection signal is based on the write data, and
wherein the second assist selection signal is based on a complement of the write data.

17. The memory device of claim 14, further comprising a word line connected to the memory cell,
wherein the write assist circuit is configured to deliver the cell voltage to the memory cell if the memory cell is not selected to receive the write data by the column selection signal and a word line voltage of the word line is active.

18. The memory device of claim 14, wherein the bit line pair is not electrically connected to the write assist circuit.

* * * * *